United States Patent
Saito et al.

(10) Patent No.: US 7,594,977 B2
(45) Date of Patent: Sep. 29, 2009

(54) TAPE BONDER, TAPE BONDING METHOD, AND PROCESS FOR MANUFACTURING ELECTRONIC COMPONENT

(75) Inventors: Kimikazu Saito, Nagano (JP); Tetsushi Suzuki, Nagano (JP)

(73) Assignee: Tsubaki Seiko, Inc, Nagano (JP)

( * ) Notice: Subject to any disclaimer, the term of this patent is extended or adjusted under 35 U.S.C. 154(b) by 354 days.

(21) Appl. No.: 11/569,468

(22) PCT Filed: Nov. 26, 2004

(86) PCT No.: PCT/JP2004/017548

§ 371 (c)(1),
(2), (4) Date: Nov. 21, 2006

(87) PCT Pub. No.: WO2005/117098

PCT Pub. Date: Dec. 8, 2005

(65) Prior Publication Data

US 2008/0011403 A1    Jan. 17, 2008

(30) Foreign Application Priority Data

May 25, 2004    (JP) ............... 2004-154047

(51) Int. Cl.
C09J 5/00    (2006.01)
B29C 65/00   (2006.01)
B32B 38/10   (2006.01)
B31D 1/02    (2006.01)

(52) U.S. Cl. .................. 156/286; 156/154; 156/248; 156/312; 156/382

(58) Field of Classification Search ............ 156/99, 156/104, 153, 154, 272.2, 273.9, 275.5, 285, 156/286, 381, 382, 103, 248, 312
See application file for complete search history.

(56) References Cited

U.S. PATENT DOCUMENTS 3,972,766 A * 8/1976 Fontvieille .............. 156/358
4,188,254 A * 2/1980 Hemperly, Jr. .......... 156/382

(Continued)

FOREIGN PATENT DOCUMENTS

EP    0488267 A2    6/1992

(Continued)

*Primary Examiner*—Jeff H Aftergut
*Assistant Examiner*—Brian R Slawski
(74) *Attorney, Agent, or Firm*—Mark Montague; Cowan, Liebowitz & Latman, P.C.

(57) ABSTRACT

A tape bonding device for bonding a tape member to a work piece: having a rubber sheet on the upper surface of which the work piece is mounted, a first vacuum chamber located on the side of the upper surface of the rubber sheet, a second vacuum chamber located on the side of the lower surface of the rubber sheet, a holding member which holds the rubber sheet without coming and going of the air between a first and a second vacuum chambers and, a tape holding unit which holds the tape member in a stretched state, and locates the tape member in the upper portion of the work piece, a first sucking unit which performs vacuum suction of a first vacuum chamber, a first air introducing unit which introduces the air into the first vacuum chamber, a second sucking unit which performs vacuum suction of a second vacuum chamber, a second air introducing unit which introduces the air into the second vacuum chamber.

15 Claims, 14 Drawing Sheets

U.S. PATENT DOCUMENTS

| | | | | |
|---|---|---|---|---|
| 4,247,355 A | * | 1/1981 | Friedrich et al. | 156/382 |
| 5,254,205 A | * | 10/1993 | Tsutsumi et al. | 156/538 |
| 5,286,329 A | * | 2/1994 | Iijima et al. | 156/297 |
| 5,800,667 A | * | 9/1998 | Kosaki et al. | 156/382 |
| 5,908,524 A | * | 6/1999 | Masui et al. | 156/212 |

FOREIGN PATENT DOCUMENTS

| | | | | |
|---|---|---|---|---|
| JP | 53006341 A | * | 1/1978 | |
| JP | 04-201145 | | 7/1992 | |
| JP | 10025456 A | * | 1/1998 | |
| JP | 10-233430 | | 9/1998 | |
| JP | 10233430 A | * | 9/1998 | |
| JP | 2000-281991 | | 10/2000 | |
| JP | 2003/007808 | | 1/2003 | |
| JP | 2003007808 A | * | 1/2003 | |

\* cited by examiner

TAPE BONDER, TAPE BONDING METHOD, AND PROCESS FOR MANUFACTURING ELECTRONIC COMPONENT

TECHNICAL FIELD

The present invention relates to a device and a method for bonding tape, and a method for manufacturing electronic components, by which a tape member is bonded to a work piece.

BACKGROUND ART

In some cases, processes for manufacturing a semiconductor includes a process in which formed semiconductor-chips are reduced in size and thickness by polishing the back of a semiconductor wafer (hereinafter, called wafer) for reduction in the thickness of the wafer after forming a circuit pattern on the surface of the wafer. Moreover, there are some cases in which reduction in the thickness of the wafer is realized in a manufacturing process of chemical etching in which liquid chemicals are used.

In the above manufacturing process, protective tape (hereinafter, called a tape member) with an adhesion property is pasted on the surface of the wafer. Thereby, a circuit is prevented from being damaged when the surface of the wafer is contaminated or scratched.

A device for bonding tape which bonds a tape member to the above surface of the wafer has been disclosed in Japanese Laid-Open Patent Application No. 2003-7808 (patent document 1 identified below). In the device for bonding tape disclosed in the patent document 1, a state in which both a chamber on the side of a main body and that on the side of an upper cover are evacuated is made to a state in which the pressure of the chamber on the side of the upper cover is switched to the atmospheric one. Thereby, there is caused a pressure difference between the chamber on the side of the upper cover and that on the side of the main body, and a rubber sheet expands into the chamber on the side of the main body by the pressure difference. Then, the rubber sheet pushes the tape member by the above expanding to bond the tape member to the work piece.

Moreover, another pasting device has been disclosed in Japanese Laid-Open Patent Application No. 2000-349047 (patent document 2 identified below). In the device disclosed in the patent document 2, the central portion of a base with excellent smoothness is bent toward the side of a tape member, using a pressure difference between a first vacuum chamber and a second vacuum one. While the base with the bent central portion is pressed against the tape member pasted on a wafer in response to the above operation, the wafer is raised by driving an up-and-down device. According to the above configuration, the tape member is bonded to the wafer while air is pushed out to the outside from the side of the central portion of the tape member.

As disclosed herein, Patent Document 1 is Japanese Laid-Open Patent Application No. 2003-7808; and Patent Document 2 is Japanese Laid-Open Patent Application No. 2000-349047.

The configuration disclosed in the above-described patent document 1 has been still at an idea level, and has not taken a concrete form. Therefore, various kinds of problems are caused when an actually concrete form is tried to be given to the above configuration. One example is that considerably large tension is required in order to remove slack by the self weight of the rubber sheet when the sheet is stretched, because the rubber sheet is located in an upper portion in the configuration disclosed in the patent document 1. Consequently, there is a problem that it is difficult to install the rubber sheet.

Especially, a space between the tape member in contact with the rubber sheet and the wafer is usually small, for efficient bonding of the tape member, at an initial position at which bonding operation of the tape member to the wafer is started. In some cases, there is caused a problem that the tape member is bonded to the wafer before a stage for vacuum suction, and bubbles are embedded between the above bonded surfaces when slack is caused in the rubber sheet under a state in which the above space is small.

Moreover, a plurality of set screws are provided, and all these screws are required to be rotated according to the configuration disclosed in the patent document 1, and, when the set screws are required to simultaneously be rotated, it is difficult to execute the required operations. Furthermore, according to the configuration disclosed in the patent document 1, it is required to set up the tape member and the wafer under a state in which the upper cover is removed. Consequently, an excess number of man-hours are required.

Moreover, according to the configuration disclosed in the patent document 2, the base of glass plate and the like are bent, using the pressure difference between the first vacuum chamber and the second vacuum one, the base is bonded to the tape member pasted on the wafer, and, at the same time, the tape member pasted on the wafer and the base are further raised from the above bonded state. Consequently, two stages are required for the bonding process to need more number of man hours, which is not preferable in the view point of the cost. Moreover, as an up-and-down device is separately required in order to raise a wafer and the like, the configuration becomes complex, and, accordingly, the cost is increased.

The present invention has been made, considering the above-described circumstances, and its object is to provide a device and a method for bonding tape, and a method for manufacturing electronic components, by which a tape member is preferably bonded to a work piece while the slack of a rubber sheet is removed, and simplified processes and reduced cost may be realized.

SUMMARY OF THE INVENTION

The present invention is a tape bonding device which bonds a tape member to a work piece, including: an elastic sheet member on the upper surface of which the work piece is mounted; a sealable first vacuum chamber which is located on the side of the upper surface of the elastic sheet member, and, at the same time, is divided by the elastic sheet member; a sealable second vacuum chamber which is located on the side of the lower surface of the elastic sheet member, and, at the same time, is divided by the elastic sheet member; a holding member which holds the elastic sheet member in a state in which the air is prevented from coming and going between the first vacuum chamber and the second vacuum chamber; a tape holding unit which holds the tape member in a stretching state, and, at the same time, locates the tape member in the upper portion of the work piece mounted on the elastic sheet member; a first sucking unit for vacuum suction of the inside of the first vacuum chamber; a first air introducing unit which introduces the air into the inside of the first vacuum chamber; a second sucking unit for vacuum suction of the inside of the second vacuum chamber; and a second air introducing unit which introduces the air into the inside of the second vacuum chamber.

By the above configuration, the work piece is mounted on the upper surface of the elastic sheet member, and the tape member is located on the upper portion of the work piece in a stretched state by the tape holding unit. Then, the first and the second sucking units are operated under the above state, and vacuum exhausting of the first and the second vacuum chambers is executed. Thereafter, the second air introducing unit is operated to introduce the air into the inside of the second vacuum chamber. Then, the elastic sheet member expands toward the inside of the first vacuum chamber by the difference in pressure between the first vacuum chamber maintaining the vacuum state and the second vacuum chamber into which the air has been introduced, wherein the elastic sheet member seals, with the holding member, the boundary portion between the first vacuum chamber and the second vacuum chamber. Then, the elastic sheet member raises the work piece by the above expansion, and the work piece makes contact with the tape member by the above raising.

When the elastic sheet member is further expanded from the above state, the work piece is further raised, while resisting the tension of the tape member in the stretched state. Thereby, preferable bonding of the tape member to all over the surface of the work piece may be realized. Thus, by mounting the work piece on the upper surface of the elastic sheet member, and by expanding the elastic sheet member in the above mounted state, the tape member may be bonded to the work piece while bubbles are prevented from entering.

Moreover, the influence of the slack of the above elastic sheet member may be removed in comparison with a case in which the work piece is located on the lower surface of the elastic sheet member. Therefore, as the slack of the rubber sheet is removed, there is no need to provide a configuration in which a large tension is given to the elastic sheet member. Accordingly, the structure of the tape bonding device may be simplified. Moreover, the tape bonding device may be manufactured in an easier manner. Furthermore, as the expansion of the elastic sheet member is used, special configuration in which the work piece is moved toward the tape member located upward is not required. Consequently, the work piece may be moved toward the tape member by use of a simple configuration.

Moreover, another aspect of the present invention, in addition to the above-described aspect of the invention, is a tape bonding device, including a controlling unit which controls the operations of the first sucking unit, the second sucking unit, the first air introducing unit, and the second air introducing unit, wherein the controlling unit performs vacuum suction of the first and the second vacuum chambers by operating the first and second sucking units, introduces the air into the second vacuum chamber by operating the second air introducing unit after the vacuum suction, expanding the elastic sheet member toward the inside of the first vacuum chamber by introducing the air, and raising the work piece toward the tape member for bonding the work piece to the tape member by expanding the elastic sheet member.

According to the above configuration, based on operation control by the controlling unit, operation of the first sucking unit and the second sucking unit is started in the first place for vacuum suction. Then, after the above vacuum suction, the second air introducing unit is operated based on the operation control by the controlling unit. Thereby, the air is introduced into the second vacuum chamber. Then, the elastic sheet member may be expanded toward the inside of the first vacuum chamber by the above introducing of the air. When the elastic sheet member is expanded, the work piece may be raised toward the tape member. Thereby, the work piece may be bonded to the tape member.

Furthermore, further another aspect of the present invention, in addition to the above-described aspects of the invention, is a tape bonding device, wherein the controlling unit operates the second sucking unit in the first place, and operates the first sucking unit in the second place at operation of the first and the second sucking units.

According to the above configuration, the pressure of the second vacuum chamber is reduced to a pressure lower than that of the first vacuum chamber by operating the second sucking unit in the first place. Therefore, the elastic sheet member is expanded toward the side of the second vacuum chamber on the lower side. Accordingly, the elastic sheet member is not expanded toward the side of the first vacuum chamber at first. Consequently, the work piece and the tape member may be prevented from being bonded at a stage before the air is introduced by operating the second air introducing unit.

Moreover, further another aspect of the present invention, in addition to the above-described aspects of the invention, is a tape bonding device, wherein the tape bonding device has a main body section, and a cover body section provided reopenable to the main body section, a sealing member, by which a space between the cover body section and the main body section is blocked airtight when the cover body section is closed to the main body section, is provided in a boundary portion between the cover body section and the main body section, the first vacuum chamber is formed between the cover body section and the elastic sheet member in the blocked state of the cover body section, and, at the same time, the second vacuum chamber is formed between a space section existing in the main body section and the elastic sheet member.

According to the above configuration, the cover body section becomes reopenable to the main body section. Accordingly, setting up of the work piece and the tape member, and taking out of the work piece in a state in which the tape member is bonded to the piece may be easily performed by opening and closing the cover body section. Moreover, by the existence of the seal member, the space between the cover body section and the main body section may be made airtight by blocking. Consequently, when the first sucking unit and the second sucking unit are operated, the first vacuum chamber and the second vacuum chamber may be sucked to a high degree of vacuum. Moreover, there may be generated a state in which the second vacuum chamber is originally located on the side of the lower surface of the elastic sheet member. Moreover, when the cover body section is closed to the main body, the first vacuum chamber is formed between the cover body section and the elastic sheet member.

Moreover, further another aspect of the present invention, in addition to the above-described aspects of the invention, is a tape bonding device, wherein the cover body section has a concave section which is depressed upward in the blocked state of the cover body section, and, at the same time, the upper bottom surface of the concave section presses downward the work piece and the tape member, which move upward, based on expansion of the elastic sheet member.

According to the above configuration, when the elastic sheet member is expanded, the work piece and the tape member are raised. When the tape member reaches a predetermined height by the above raising, the tape member runs into the upper bottom surface, and is pressed downward. Consequently, bonding is executed in a state in which the tape member is pressed from the upper side, and, at the same time, the work piece is raised from the lower side. That is, as the work piece is raised upward and pressed against the tape member while the tape member is pressed from the upper side, bonding between the work piece and the tape member may be made solid and reliable.

Furthermore, further another aspect of the present invention, in addition to the above-described aspects of the invention, is a tape bonding device, wherein a sensor is provided in a boundary portion between the cover body section and the main body section in order to detect a state in which the cover body section is closed to the main body section, and may transmit a detection signal to the controlling unit, and the controlling unit operates the first sucking unit or the second sucking unit only when the detection signal corresponding to the state in which the cover body section is closed is received from the sensor.

According to the above configuration, the sensor may detect a state in which the cover body section is closed to the main body section. Then, the above controlling unit may recognize the closed state by transmitting the detection signal based on the above detection to the controlling unit. Moreover, the controlling unit does not operate the first sucking unit and the second sucking unit before the closing state is recognized. Consequently, vacuum suction may be performed only when the cover body section is surely blocked, and useless vacuum suction may be prevented.

Moreover, even when a foreign substance is inserted between the cover body section and the main body section by mistake, the above foreign substance may be easily removed because the first sucking unit and the second sucking unit are not operated. Consequently, damage may be prevented from being caused between the cover body section and the main body.

Furthermore, further another aspect of the present invention, in addition to the above-described aspects of the invention, is a tape bonding device, wherein the tape holding unit is installed to the holding member through a pin member. According to the above configuration, the pin member exists between the tape holding unit and the holding member, and a space is caused at a location in which the above pin member does not exist. Then, sucking and exhausting of the air which exists in the space between the tape holding unit and the holding member may be performed from the above space by the first sucking unit. That is, preferable sucking and exhausting of the air which exists between the work piece and the tape member may be performed.

Moreover, further another aspect of the present invention, in addition to the above-described aspects of the invention, is a tape bonding device, wherein the work piece is a glass substrate, and the pin member is provided with: a first supporting member which is provided in the holding member, and, at the same time, protrudes toward the side opposing to the tape holding unit; and a plurality of second supporting members which are provided in the holding member, and protrude toward the side opposing to the tape holding unit, and the protruding length of the second supporting members is longer than that of the first supporting member.

According to the above configuration, the tape holding unit is supported by the first supporting member and the second supporting member. Consequently, with regard to the tape member fixed to the tape holding unit, the height is lower in the vicinity of the first supporting member, and the height is higher in the vicinity of the second supporting member. Therefore, the height of the tape member may be lowered in comparison with a case in which the whole surface is supported by the second supporting member, and, considering the bending of the tape member, extra space may be generated above the above tape member. Moreover, the depth of the concave section existing in the cover body section is not required to be increased to a depth deeper than a required quantity. Consequently, when there is a little extra space, the depth of the concave portion may be increased by cutting and the like, and may be arbitrarily adjusted.

Moreover, further another aspect of the present invention, in addition to the above-described aspects of the invention, is a tape bonding device, wherein the cover body section is provided with an opening and closing auxiliary unit which assists opening and closing of the cover body section to the main body section. According to the above configuration, when the cover body section is opened and closed, the opening and closing auxiliary unit acts. Therefore, operation by which the operator opens and closes the cover body section may be made easier to reduce the load of the operator.

Moreover, further another aspect of the present invention, in addition to the above-described aspects of the invention, is a tape bonding device, wherein the opening and closing auxiliary unit includes: an installing shaft which extends from a supporting point around which the cover body section is pivoted, toward the side opposing to the side in which the cover body section is provided; weights installed on the installing shaft; a protruding portion provided in the installing shaft; an arm which is pivotably provided to the main body section, is provided on the side to which the installing shaft is moved along with opening operation of the cover body section, and, at the same time, extends toward the installing shaft; and a notch section which is provided on the arm at a location into which the protruding portion runs, engages the protruding portion, restricts pivoting of the arm when the protruding portion engages the notch section, and keeps maintaining the opened state of the cover body section by maintaining the engaged state of the protruding portion.

According to the above configuration, as weights are installed on the installing shaft, the cover body section may be opened by a little force. Moreover, when the cover body section is closed, the cover body section is prevented from rapidly closing by the gravitation of the cover body section, and a problem that the cover body section and the main body are damaged may be prevented. Furthermore, the protruding portion engages the notch section provided on the arm, and pivoting of the arm is restricted in a state in which the above protruding portion is engaged with the notch section to realize a state in which an opened state of the cover body section may be preferably maintained. Therefore, the operator is not required to maintain the open state of the cover body section by pressing the cover body section by hand, and the like. Therefore, the operator may perform other operations such as carrying of the work piece, and the benefit and convenience are improved.

Moreover, further another aspect of the present invention, in addition to the above-described aspects of the invention, is a tape bonding device, wherein a heat-hardening-type bonding agent is spread over the tape member, the cover body section is provided with a heating means, and the tape member is heated by the heating means when the tape member is bonded to the work piece. According to the above configuration, as the heat-hardening-type bonding agent is spread over the surface of the tape member, the bonding performance to the work piece may be improved when the heating means is heated. When the tape member is pressed against the work piece in the above state, preferable bonding of the tape member to the work piece may be realized.

Moreover, further another aspect of the present invention, in addition to the above-described aspects of the invention, is a tape bonding device, wherein a plurality of the heating means are provided in a storage section adjacent to the concave portion on the cover body section, and, at the same time, the plurality of the heating means are radially arranged in the storage section. According to the above configuration, the whole of the tape member may be preferably heated, using the heating means. Therefore, bonding of the tape member to the work piece may be improved.

Moreover, another aspect of the present invention is a tape bonding device which bonds a tape member to a work piece, including: an elastic sheet member on the upper surface of which the work piece is mounted; a sealable first vacuum chamber which is located on the side of the upper surface of the elastic sheet member, and, at the same time, is divided by the elastic sheet member; a sealable second vacuum chamber which is located on the side of the lower surface of the elastic sheet member, and, at the same time, is divided by the elastic sheet member; a holding member which holds the elastic sheet member in a state in which the air is prevented from coming and going between the first chamber and the second chamber; a tape holding unit which holds the tape member in a stretching state, and, at the same time, locates the tape member in the upper portion of the work piece mounted on the elastic sheet member; and an adjusting unit by which the pressure in the first chamber is adjusted to be lower than that of the second chamber.

According to the above configuration, the work piece is mounted on the upper surface of the elastic sheet member, and the tape member is located above the work piece in a state in which the tape member is stretched by the tape holding unit. And, the adjusting unit is operated under the above state, and pressure adjustment of the first chamber and the second chamber is performed. Then, the elastic sheet member expands toward the inside of the first chamber by the difference in pressure between the first chamber and the second chamber, wherein the elastic sheet member seals, with the holding member, the boundary portion between the first chamber and the second chamber. Then, the elastic sheet member raises the work piece by the above expansion, and the work piece makes contact with the tape member by the above raising.

When the elastic sheet member is further expanded from the above state, the work piece is further raised, while resisting the tension of the tape member in the stretched state. Thereby, preferable bonding of the tape member to all over the surface of the work piece may be realized. Thus, by mounting the work piece on the upper surface of the elastic sheet member, and by expanding the elastic sheet member in the above mounted state, the tape member may be bonded to the work piece while bubbles are prevented from entering.

Moreover, the influence of the slack of the above elastic sheet member may be removed in comparison with a case in which the work piece is located on the lower surface of the elastic sheet member. Therefore, in order to remove the slack of the rubber sheet, there is no need to provide a configuration in which a large tension is given to the elastic sheet member. Accordingly, the structure of the tape bonding device may be simplified. Moreover, the tape bonding device may be manufactured in an easier manner. Furthermore, as the expansion of the elastic sheet member is used, special configuration in which the work piece is moved toward the tape member located upward is not required. Consequently, the work piece may be moved toward the tape member by use of a simple configuration.

Moreover, another aspect of the present invention is a method for bonding a tape, by which a tape member is bonded to a work piece, including: a sucking step at which, in a state in which the work piece is mounted on the upper surface of an elastic sheet member, and the tape member is located in a stretched state in the upper portion of the work piece by a tape holding unit, vacuum suction of a first vacuum chamber located on the side of the upper surface of the elastic sheet member is performed by a first sucking unit, and, at the same time, vacuum suction of a second vacuum chamber located on the side of the lower surface of the elastic sheet member is performed by a second sucking unit; a vacuum achievement detecting step at which it is detected that the first vacuum chamber and the second vacuum chamber have reached a predetermined degree of vacuum by the sucking step; a first air introducing step at which, after reaching the degree of vacuum predetermined by the vacuum achievement detecting step is detected, vacuum suction of the second vacuum chamber is stopped by stopping operation of the second sucking unit, and, at the same time, the air is introduced into the second vacuum chamber by operating a second air introducing unit; a bonding step at which, after the first air introducing step, the elastic sheet member is expanded toward the inside of the first vacuum chamber, the work piece is raised toward the tape member by expanding the elastic sheet member, and the work piece is bonded to the tape member; and a second air introducing step at which, after executing the bonding step for a predetermined time, the air is introduced into the first vacuum chamber by operating a first air introducing unit.

According to the above configuration, vacuum suction of the first vacuum chamber and the second vacuum chamber is performed at the sucking step. After the above sucking step, it is detected at the vacuum achievement detecting step whether the predetermined degree of vacuum is reached. Then, when it is detected that the set degree of vacuum has been reached, the air is introduced into the second vacuum chamber by operating the second air introducing unit at the first air introducing step. Thereby, the elastic sheet member is started to expand toward the first vacuum chamber on the side of the upper surface.

Thereafter, the bonding step is started, and the work piece is raised by expansion of the elastic sheet member and is bonded to the tape member. When the above expansion is continued for a predetermined time, bonding of the tape member to all over the surface of the work piece may be realized by the continued expanding. After the above bonding, when the first air introducing unit is operated, and the air is introduced into the first vacuum chamber, both the pressure of the first vacuum chamber and that of the second vacuum chamber become a pressure equal to the atmospheric pressure. Then, bonding of the tape member to the work piece is completed.

Thus, by mounting the work piece on the upper surface of the elastic sheet member, and by expanding the elastic sheet member in the above mounted state, the tape member may be bonded to the work piece while bubbles are prevented from entering. Moreover, the influence of the slack of the above elastic sheet member may be removed in comparison with a case in which the work piece is located on the lower surface of the elastic sheet member. Therefore, in order to remove the slack of the rubber sheet removed, there is no need to provide a configuration in which a large tension is given to the elastic sheet member. Accordingly, the bonding may be simplified. Moreover, the tape bonding device may be manufactured in an easier manner. Furthermore, as the expansion of the elastic sheet member is used, a special step at which the work piece is moved toward the tape member located upward is not required. Consequently, the work piece may be moved toward the tape member by use of a simple method.

Moreover, further another aspect of the present invention, in addition to the above-described aspects of the invention, is a method for bonding a tape, wherein at the sucking step, when the first and the second sucking units are operated, the second sucking unit is operated in the first place, and the first sucking unit is operated in the second place.

According to the above method, the pressure of the second vacuum chamber is reduced to a pressure lower than that of the first vacuum chamber by operating the second sucking unit in the first place. Therefore, the elastic sheet member is expanded toward the side of the second vacuum chamber on the lower side. Accordingly, the elastic sheet member is not expanded toward the side of the first vacuum chamber at first. Consequently, the work piece and the tape member may be prevented from being bonded at a stage before the air is introduced by operating the second air introducing unit.

Moreover, further another aspect of the present invention, in addition to the above-described aspects of the invention, is a method for bonding a tape, including a heating step at which a heat-hardening-type bonding agent is spread over the tape member, and, at the same time, the tape member is heated before the tape member is bonded to the work piece at the bonding step.

According to the above method, as the heat-hardening-type bonding agent is spread over the surface of the tape member, the bonding performance to the work piece may be improved when heating is performed at the heating step. When the tape member is pressed against the work piece in the above state at the bonding step, preferable bonding of the tape member to the work piece may be realized.

Moreover, another aspect of the present invention is a method for manufacturing electronic components, by which a tape member is bonded to a work piece to manufacture the electronic components, including: a sucking step at which, in a state in which the work piece is mounted on the upper surface of an elastic sheet member, and the tape member is located in a stretched state in the upper portion of the work piece by a tape holding unit, vacuum suction of a first vacuum chamber located on the side of the upper surface of the elastic sheet member is performed by a first sucking unit, and, at the same time, vacuum suction of a second vacuum chamber located on the side of the lower surface of the elastic sheet member is performed by a second sucking unit; a vacuum achievement detecting step at which it is detected that the first vacuum chamber and the second vacuum chamber have reached a predetermined degree of vacuum by the sucking step; a first air introducing step at which, after reaching the degree of vacuum predetermined by the vacuum achievement detecting step is detected, vacuum suction of the second vacuum chamber is stopped by stopping operation of the second sucking unit, and, at the same time, the air is introduced into the second vacuum chamber by operating a second air introducing unit; a bonding step at which, after the first air introducing step, the elastic sheet member is expanded toward the inside of the first vacuum chamber, the work piece is raised toward the tape member by expanding the elastic sheet member, and the work piece is bonded to the tape member; and a second air introducing step at which, after executing the bonding step for a predetermined time, the air is introduced into the first vacuum chamber by operating a first air introducing unit.

According to the above method, vacuum suction of the first vacuum chamber and the second vacuum chamber is performed at the sucking step. After the above sucking step, it is detected at the vacuum achievement detecting step whether the predetermined degree of vacuum is reached. Then, when it is detected that the set degree of vacuum has been reached, the air is introduced into the second vacuum chamber by operating the second air introducing unit at the first air introducing step. Thereby, the elastic sheet member is started to expand toward the first vacuum chamber on the side of the upper surface.

Thereafter, the bonding step is started, and the work piece is raised by expansion of the elastic sheet member and is bonded to the tape member. When the above expansion is continued for a predetermined time, bonding of the tape member to all over the surface of the work piece may be realized by the continued expanding. After the above bonding, when the first air introducing unit is operated, and the air is introduced into the first vacuum chamber, both the pressure of the first vacuum chamber and that of the second vacuum chamber become a pressure equal to the atmospheric pressure. Then, bonding of the tape member to the work piece is completed.

Thus, by mounting the work piece on the upper surface of the elastic sheet member, and by expanding the elastic sheet member in the above mounted state, the tape member may be bonded to the work piece while bubbles are prevented from entering. Moreover, the influence of the slack of the above elastic sheet member may be removed in comparison with a case in which the work piece is located on the lower surface of the elastic sheet member. Therefore, in order to remove the slack of the rubber sheet, there is no need to provide a configuration in which a large tension is given to the elastic sheet member. Accordingly, the bonding may be simplified. Moreover, the tape bonding device may be manufactured in an easier manner. Furthermore, as the expansion of the elastic sheet member is used, a special step at which the work piece is moved toward the tape member located upward is not required. Consequently, electronic components used for semiconductor devices, liquid crystal displays, and the like may be manufactured accurately by use of a simple method, for example, by moving the work piece of the semiconductor substrate, the glass plate, and the like toward the tape member.

Moreover, further another aspect of the present invention, in addition to the above-described aspects of the invention, is a method for manufacturing electronic components wherein at the sucking step, when the first and the second sucking units are operated, the second sucking unit is operated in the first place, and the first sucking unit is operated in the second place.

According to the above method, the pressure of the second vacuum chamber is reduced to a pressure lower than that of the first vacuum chamber by operating the second sucking unit in the first place. Therefore, the elastic sheet member is expanded toward the side of the second vacuum chamber on the lower side. Accordingly, the elastic sheet member is not expanded toward the side of the first vacuum chamber at first. Consequently, the work piece and the tape member may be prevented from being bonded at a stage before the air is introduced by operating the second air introducing unit. Accordingly, costs for manufacturing electronic components may be made cheaper by improving the yield rate.

Moreover, further another aspect of the present invention, in addition to the above-described aspects of the invention, is a method for manufacturing electronic components including a heating step at which a heat-hardening-type bonding agent is spread over the tape member, and, at the same time, the tape member is heated before the tape member is bonded to the work piece at the bonding step.

According to the above method, as the heat-hardening-type bonding agent is spread over the surface of the tape member, the bonding performance to the work piece may be improved when heating is performed at the heating step. When the tape member is pressed against the work piece in the above state at the bonding step, preferable bonding of the tape member to the work piece may be realized. Accordingly, costs for manufacturing electronic components may be made cheaper by improving the yield rate.

EFFECTS OF THE INVENTION

According to the present invention, a tape member can be preferably bonded to a work piece while the slack of an elastic sheet member is removed. Simplified processes and reduced cost may be realized.

DETAILED DESCRIPTION OF THE INVENTION

FIRST EMBODIMENT

Figure 2:
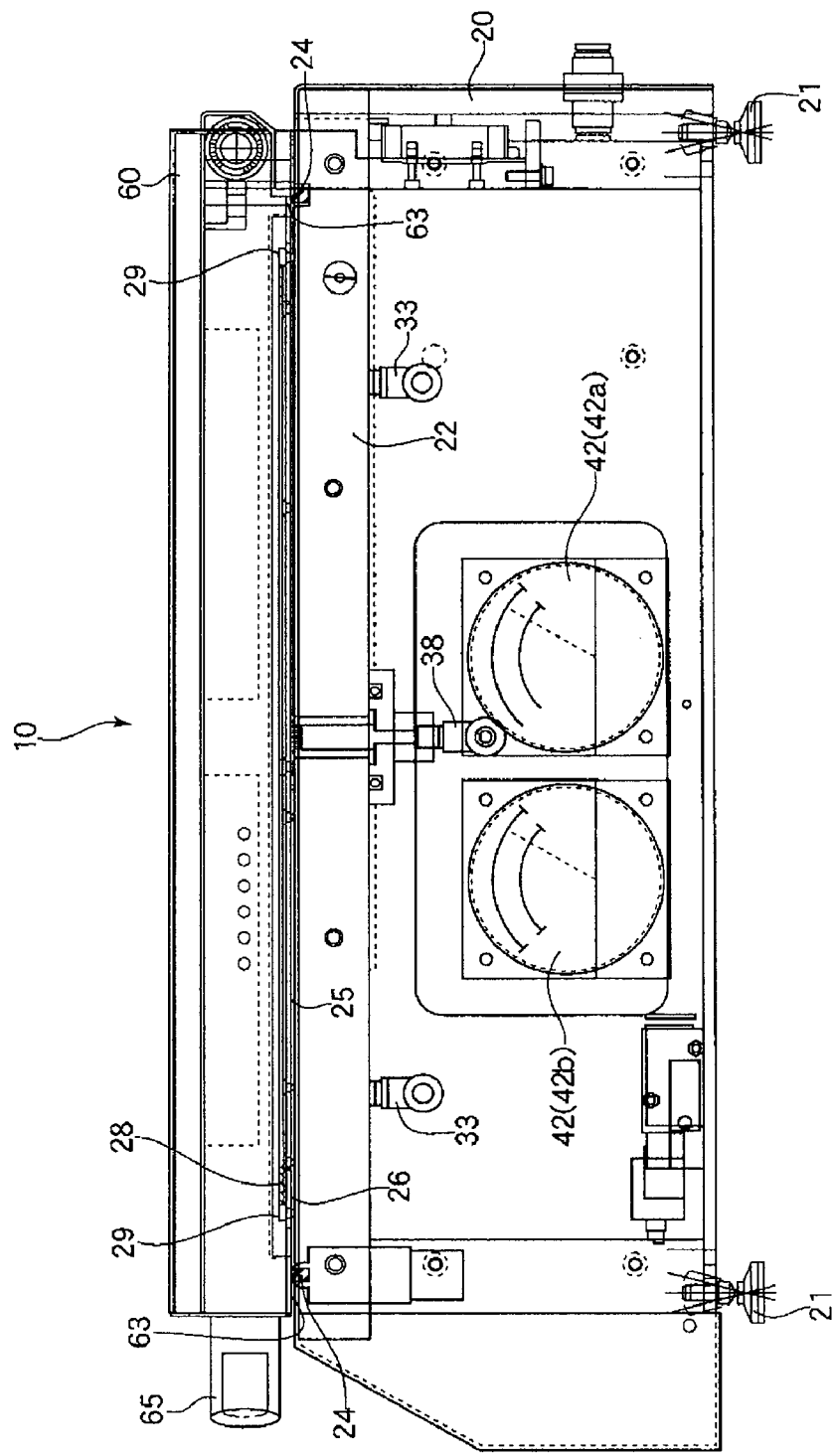
FIG. 2 is a view showing the configuration of the tape bonding device shown in FIG. 1, and a perspective side view of a part of the internal configuration under a state in which the cover body section is closed.
Figure 3:
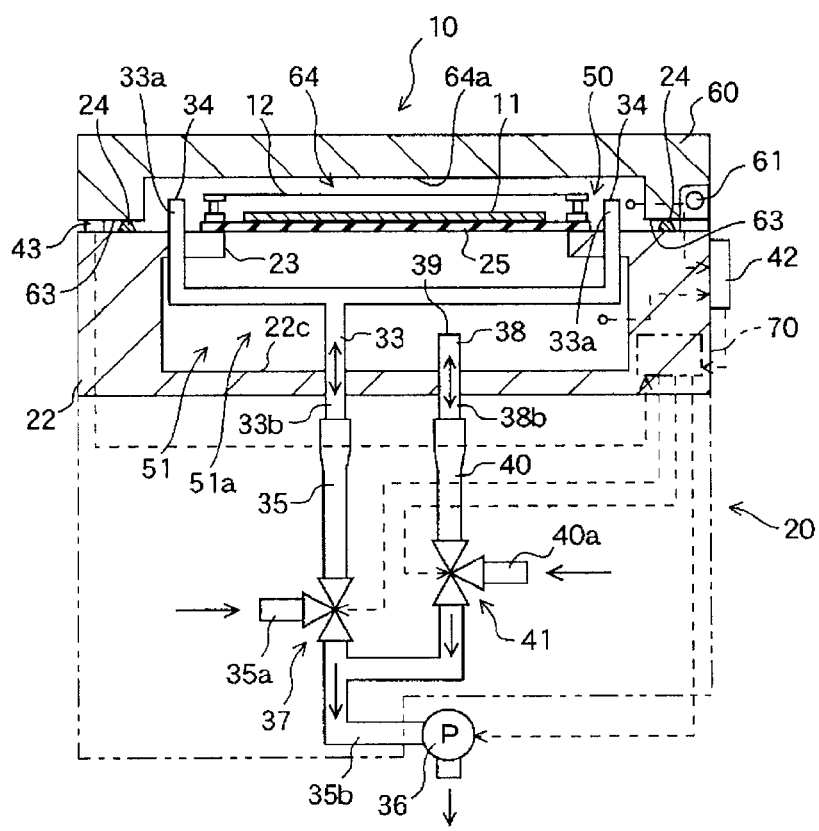
FIG. 3 is a schematic view showing a simplified configuration of an exhaust system and a control system in the tape bonding device shown in FIG. 1.

Hereinafter, a tape bonding device 10 according to the first embodiment of the present invention will be explained, referring to FIG. I through FIG. 7. FIG. I is a plan view of a main body section 20 seen through a cover body section 60 shown in FIG. 2, and the drawing shows a state in which a wafer 11 is mounted on a rubber sheet 25. Moreover, FIG. 2 is a perspective side view of the internal configuration of a part of components (rubber sheet 25 and the like) in the tape bonding device. Moreover, FIG. 3 is a schematic view showing a simplified configuration of an exhaust system and a control system in the tape bonding device 10 shown in FIG. 1.

Figure 1:
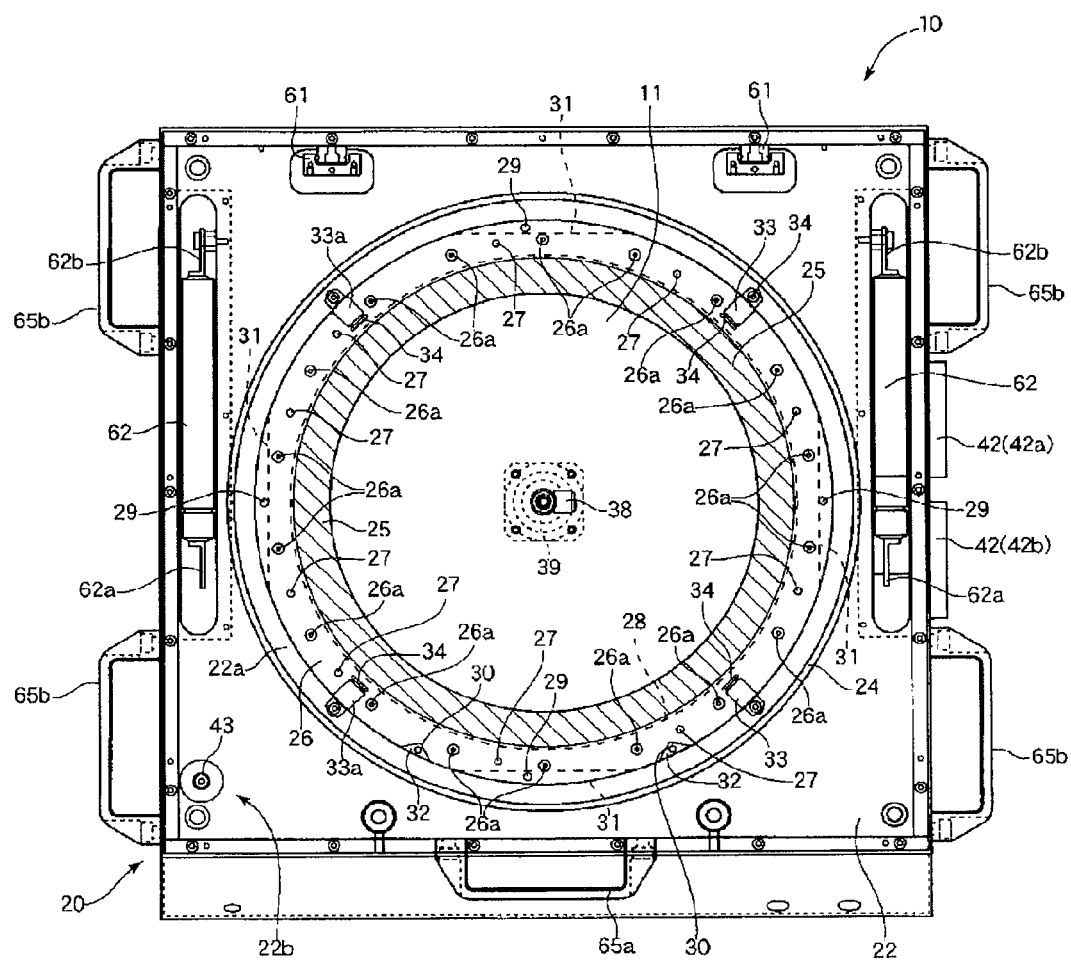
FIG. 1 is a view showing the configuration of a tape bonding device according to a first embodiment of the present invention, and a perspective plan view of a cover body section in a state in which a wafer is arranged on a rubber sheet.

As shown in FIG. 1, the plane shape of the main body section 20 is of, for example, a substantially square shape. A plurality (for example, four) of supporting legs 21 (refer to FIG. 2) are installed on the bottom surface of the main body section 20. Moreover, the tape bonding device 10 has, as shown in FIG. 2, the main body section 20, and the cover body section 60 which is pivotably provided on the main body section 20.

A main-body top-surface section 22, which is adjacent and is opposing to the cover body section 60, is provided in the main body section 20. The main-body top-surface section 22 is configured to have appropriate strength in such a way that applied pressure (a vertical load applied, especially, from the side of the cover body section 60) at vacuum suction is received. Moreover, sidewalls and a bottom wall which support the main body section 20 and form a part thereof are configured to have enough strength in such a way that applied pressure at vacuum suction is carried.

A hole section 23 (refer to FIG. 3) is provided in the central portion of the main-body top-surface section 22. The hole section 23 is covered with the rubber sheet 25 as will be described later. Moreover, a seal ring 24 is installed on the main-body top-surface section 22 as shown in FIG. 1 through FIG. 3. The seal ring 24 is a member with an O-ring shape, and is applied against a ring applied section 63 on the side of the cover body section 60. Thereby, the inside of the tape bonding device 10 may be insulated from the outside (the air) for vacuum suction thereof.

Moreover, the rubber sheet 25 as an elastic sheet member is provided on the side (refer to FIG. 1; hereinafter, called an inside diameter section 22a) of the central portion inner than the seal ring 24 on the main-body top-surface section 22 in such a way that the hole section 23 is covered. The above rubber sheet 25 is a member on the upper surface of which the wafer 11 as a work piece is mounted. Then, the wafer 11 rises toward the tape member 12, which will be described later, by expanding the rubber sheet 25 upward, as will be described later, in a state in which the wafer 11 is mounted.

The rubber sheet 25 is formed with a material, such as chloroprene, which may reduce generation of bubbles. However, the material of the rubber sheet 25 is not limited to the above chloroprene, and usual natural rubber, synthetic rubber, or the like may be applied. Here, the material of the rubber sheet 25 is preferably a material, such as the above-described chloroprene, which may prevent generation of bubbles.

Here, the inside of the tape bonding device 10 is divided into two spaces by the existence of the above rubber sheet 25 (refer to FIG. 3). In the following explanation, it is assumed that, in a state in which the cover body section 60 is closed, a space on the upper side of the rubber sheet 25 is a first vacuum chamber 50, and a space on the lower side of the rubber sheet 25 is a second vacuum chamber 51. Moreover, the second vacuum chamber 51 uses a space section 51a which exists in the main body section 20. Here, though the first vacuum chamber 50 is divided into a space between the tape member 12 and the cover body section 60, and a space between the tape member 12 and the rubber sheet 25, the both spaces communicate with each other to form the first vacuum chamber 50 as a whole.

Moreover, the diameter of the wafer 11 mounted on the upper surface of the rubber sheet 25 is 12 inches in the present embodiment. However, the size of the wafer 11 is not especially limited to the above one, and a wafer with another size, such as an 8-inch wafer, may be applied. Here, when the size of the wafer 11 is changed, the sizes of other members (the rubber sheet 25, a pressing ring 26, a tape frame 28, and the like) are required to be changed according to the changed size of the wafer 11. At any rate, the tape bonding device 10 according to the present embodiment may be used, for example, for bonding the wafer 11 with a small size, such as the 8-inch wafer.

Figure 4:
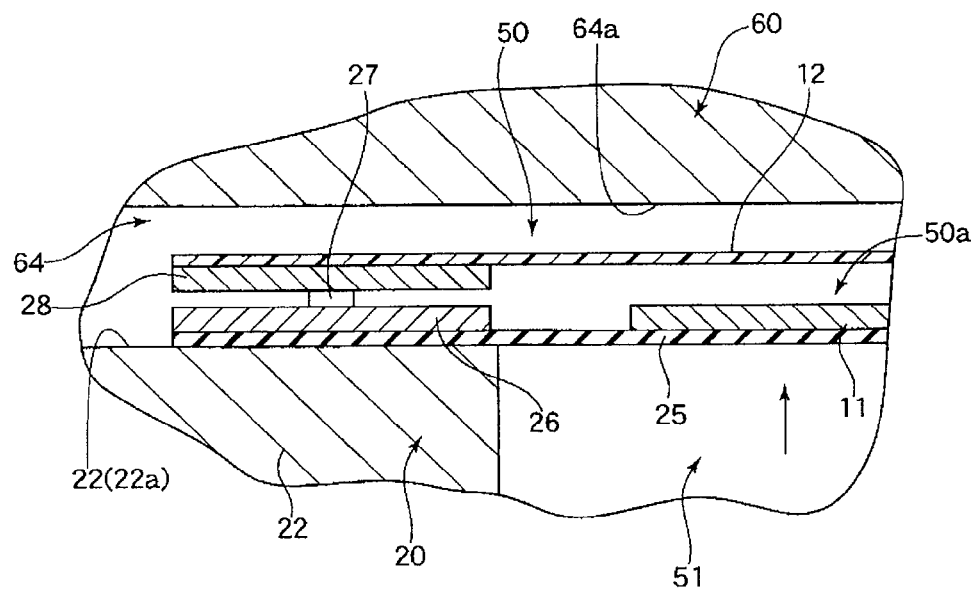
FIG. 4 is a partial cross-sectional side view showing the enlarged configuration in which a rubber sheet and a tape member in the tape bonding device shown in FIG. 1 are held.

As shown in FIG. 4, the pressing ring 26 with an appearance of a substantially ring shape is installed on the outer peripheral edge portion in the upper portion of the rubber sheet 25 as a holding member. The pressing ring 26 is provided for pressing the rubber sheet 25. The inside diameter section 22a is pressed against the above pressing ring 26 from the upper side of the section 22a, and is fixed, for example, with screws 26a (refer to FIG. 1) along the peripheral direction at appropriate intervals. Here, the above screws 26a extend through the rubber sheet 25 when the pressing ring 26 is fixed with the screws 26a. Therefore, a hole corresponding to the through hole of the screw 26a may be formed on the rubber sheet 25 beforehand. However, a screw (not shown) for installing a pin member 27 which will be described later may be configured to simultaneously be used for installing the pressing ring 26.

As shown in FIG. 4, the pin members 27 are installed in the peripheral direction at appropriate intervals on parts of the upper surface of the pressing ring 26. The tape frame 28 as a tape holding unit is installed in the upper portion of the pin members 27. The tape frame 28 is provided for maintaining a state in which the tape member 12 such as ultraviolet-curing type ultraviolet-light (UV) tape is stretched. Therefore, the upper surface of the tape frame 28 is covered by the tape member 12. Here, the tape member 12 is stretched on the tape frame 28 under a state in which the adhesive surface of the tape member 12 is turned downward (the side of the wafer 11).

Moreover, a plurality of positioning pins 29 (four positioning pins at intervals of approximately 90 degrees in FIG. 1) are installed for the tape frame 28. Furthermore, at least one or more locking pins 30 (two locking pins in FIG. 1) are installed for the tape frame 28.

Moreover, a plurality of notch sections 31 (four sections at intervals of approximately 90 degrees in FIG. 1) are provided on the tape frame 28, corresponding to each of the positioning pins 29. The notch section 31 is formed in such a way that a part of the outer peripheral side of the tape frame 28 is cut out. The displacement in the plane direction of the tape frame 28 may be prevented by locating the above-described positioning pin 29 in such a way that the pin 29 is applied against the edge portion of the above notch section 31. Thereby, the displacement may be prevented from being caused when the tape member 12 is bonded to the wafer 11.

Moreover, pin holding sections 32 (two sections in FIG. 1 under a state in which the notch section 31 on the near side is held between the section) are provided on the tape frame 28, corresponding to each of the locking pins 30. The above pin holding section 32 is formed in such a way that a part of the tape frame 28 is cut out into, for example, a substantially triangle shape. Thereby, the locking pin 30 may make contact with the edge portion of the above pin holding section 32 to prevent the tape frame 28 from being rotated clockwise and counter-clockwise. Furthermore, when the tape member 12 and the wafer 11 are bonded to each other, the displacement may be prevented even by the above rotation-preventing configuration.

Moreover, FIG. 4 illustrates position relations among the rubber sheet 25, the wafer 11, the pressing ring 26, the pin member 27, the tape frame 28, and the tape member 12. As shown in the above drawing, there is a predetermined gap 50a between the tape member 12 and the wafer 11 in a state in which the wafer 11 is mounted on the rubber sheet 25. However, when the rubber sheet 25 is expanded as will be described later, the wafer 11 mounted on the rubber sheet 25 is raised to set the gap 50a in such a way that the wafer 11 and the tape member 12 are preferably bonded to each other.

Moreover, the end portion of an air duct 33 is arranged, as shown in FIG. 3, in the inside of the first vacuum chamber 50 in order to perform vacuum suction of the first vacuum chamber 50. One end portion 33a of the above air duct 33 branches to four pieces (only two pieces are displayed as an cross sectional view in FIG. 3.). And, opening sections 34 of each branched air duct 33 exist in the inside of the first vacuum chamber 50 as shown in FIG. 3. Moreover, the openings 34 are arranged at intervals of approximately 90 degrees in the plan view shown in FIG. 1, based on the present embodiment. Moreover, there is the opening 34 between the tape frame 28 and the seal ring 24 in the inside diameter section 22a on the internal side of the seal ring 24. Moreover, the air ducts 33 extend through the inside diameter section 22a, and join to one from the branched state in the inside of the second vacuum chamber 51, or in the outside of the main body section 20 (refer to FIG. 1 and FIG. 3).

Moreover, the other end portion 33b of the air duct 33 is protruding from a bottom wall 22c in the main-body top-surface section 22. Moreover, one end portion of the tube member 35 is connected to the other end portion 33b, and the other end portion 35b of the above tube member 35 is connected to a vacuum pump 36. Thereby, vacuum suction of the first vacuum chamber 50 may be performed when the vacuum pump 36 is operated.

Moreover, a first valve member 37 is provided in a mid portion of the tube member 35. This first valve member 37 has a configuration in which the member 37 may be switched to the side for communicating with the vacuum pump 36 (hereinafter, the above switching is called switching to the suction side) for vacuum suction of the inside of the first vacuum chamber 50, and, at the same time, may be switched to the side for introducing the air (switched to the side of a protruded tube section 35a in FIG. 3; hereinafter, the above switching is called switching to the air introducing side). When the tube member 35 is opened to the air introducing side by switching the first valve member 37, the air is introduced into the inside of the first vacuum chamber 50 through the above tube member 35. Moreover, for example, an electromagnetic valve which may be opened and closed with a solenoid may be used for the first valve member 37, and, moreover, a method by which opening and closing is executed by using other driving sources such as a motor may be applied.

Moreover, the vacuum pump 36 is provided outside the main body section 20 in the present embodiment. However, there may be applied a configuration in which the vacuum pump 36 is included in the inside of the main body section 20. Here, a first sucking unit includes the above vacuum pump 36, the air duct 33, the tube member 35, the first valve member 37, and the like. Moreover, a first air introducing unit includes the first valve member 37, the air duct 33, the tube member 35, the protruded tube section 35a and the like.

Moreover, the above vacuum pump 36 and the above first valve member 37 are connected to the controlling device 70 which will be described later, and operate after a signal corresponding to a control instruction from the above controlling device 70 has been received.

Moreover, an air duct 38 is also provided in the inside of the second vacuum chamber 51 as in the case of the above-described air duct 33. The above air duct 38 is different from the air duct 33 in a point that only one air duct 38 is provided in the inside of the second vacuum chamber 51. Moreover, an opening 39 of the air duct 38 is located at a center of the inside of the second vacuum chamber 51.

Furthermore, as in the case of the above-described air duct 33, the other end portion 38b of the air duct 38 is protruding from the bottom wall 22c of the main-body top-surface section 22, and, at the same time, the side of one end of the tube member 40 is connected to the other end portion 38b. Moreover, the other end portion of the tube member 40 is connected to the vacuum pump 36. Thereby, vacuum suction of the second vacuum chamber 51 may be performed when the vacuum pump 36 is operated.

Moreover, a second valve member 41 is provided in a mid portion of the tube member 40. This second valve member 41 also has a configuration in which the member 41 may be switched to the side for communicating with the vacuum pump 36, and, at the same time, may be switched to the air introducing side through a protruded tube section 40a as in the case of the above-described first valve member 37. When the tube member 40 is opened to the air introducing side by switching the second valve member 41, the air is introduced into the inside of the second vacuum chamber 51 through the above tube member 40. Here, the second valve member 41 is also electrically connected to the controlling device 70.

Furthermore, a second sucking unit includes the vacuum pump 36, the second valve member 41, the air duct 38, and the tube member 40. Moreover, a second air introducing unit includes the second valve member 41, the air duct 38, the tube member 40, the protruded tube section 40a and the like.

Moreover, only one vacuum pump 36 is provided in the present embodiment. Moreover, vacuum suction of either of the first vacuum chamber 50 or the second vacuum chamber 51, or both of the chambers 50 and 51, and/or bringing either of the first vacuum chamber 50 or the second vacuum chamber 51, or both of the chambers 50 and 51 into an atmospheric pressure state may be realized by switching the first valve member 37 to the air introducing side, or to the suction side, and/or the second valve member 41 to the air introducing side, or to the suction side.

However, the number of the vacuum pump 36 is not limited to one, but there may be applied a configuration in which two or more pumps is provided, corresponding to each of the first sucking unit and the second sucking unit. Moreover, there may be another configuration in which both of a valve member to the suction side and a valve member to the air introducing side are provided in each of the tube member 35 and the tube member 40 without using a three way valve such as the first valve member 37 and the second valve member 41. Even according to the above configurations, suction of the first vacuum chamber 50 and the second vacuum chamber 51 may be preferably realized by switching.

Furthermore, a vacuum gage 42 is installed on the outer surface of the sidewall of the main body section 20 as shown in FIG. 2. Two vacuum gages 42 are provided in the present embodiment. One of the above vacuum gages 42 measures atmospheric pressures of the inside of the first vacuum chamber 50 (hereinafter, called a vacuum gage 42a as required). Moreover, the other one of the vacuum gages 42 measures atmospheric pressures of the inside of the second vacuum chamber 51 (hereinafter, called a vacuum gage 42b as required). Furthermore, both of the above two vacuum gages 42a and 42b are connected to the controlling device 70.

Moreover, a sensor 43 is provided at one corner portion 22b (Refer to FIG. 1) among two corner portions on the main-body top-surface section 22, wherein the two corner portions are most remote from, for example, hinges 61, which will be described later. The sensor 43 uses, for example, a magnetic sensor, and detects whether the cover body section 60 is closed in such a way that the section 60 approaches the main body section 20 within a predetermined distance. Moreover, the above sensor 43 is also connected to the controlling device 70, and transmits a detection signal, which detects whether the cover body section 60 is closed, to the controlling device 70. Then, the controlling device 70 transmits a signal corresponding to an operation to the vacuum pump 36 and the like only when the detection signal corresponding to a state, in which the cover body section 60 is closed, is received.

Subsequently, the configuration of the cover body section 60 will be explained. As shown in FIG. 1, FIG. 3, FIG. 5(a), and FIG. 5(b), the cover body section 60 is connected to the main body section 20 through the hinge 61. That is, the cover body section 60 may be pivoted about the hinges 61. Moreover, one end 62a of each of two damper members 62 is installed to the cover body section 60. Moreover, the other end 62b of each of the damper members 62 is installed to the main-body top-surface section 22. This damper member 62 is configured to be retractable, and, at the same time, the viscous resistance of a viscous body (oil and the like) existing in the member 62 prevents the cover body section 60 from being rapidly lowered to the main body section 20.

Figure 5A:
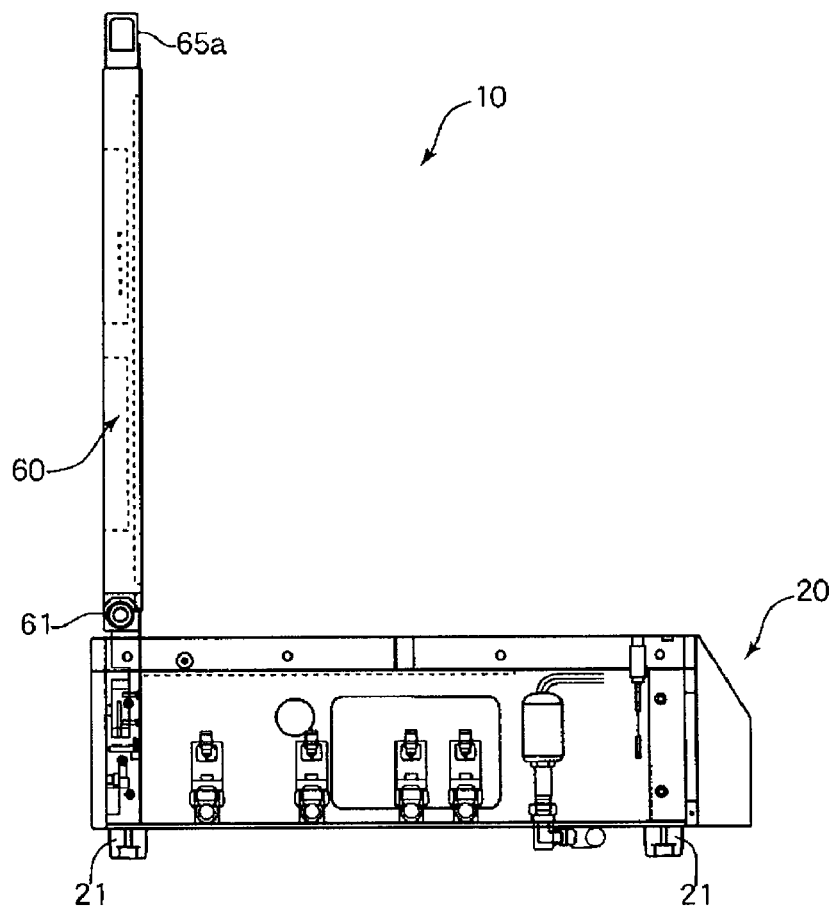
FIG. 5(a) is a view showing the configuration of the tape bonding device shown in FIG. 1, and a perspective side view of a part of internal configuration in a state in which the cover body section is opened.

Moreover, the damper member 62 includes a spring member (not shown), and may maintain a state (for example, a state shown in FIG. 5(a)) in which the cover body section 60 is opened. However, when the state in which the cover body section 60 is opened is not required to be maintained, the spring member may be configured to be eliminated.

Figure 5B:
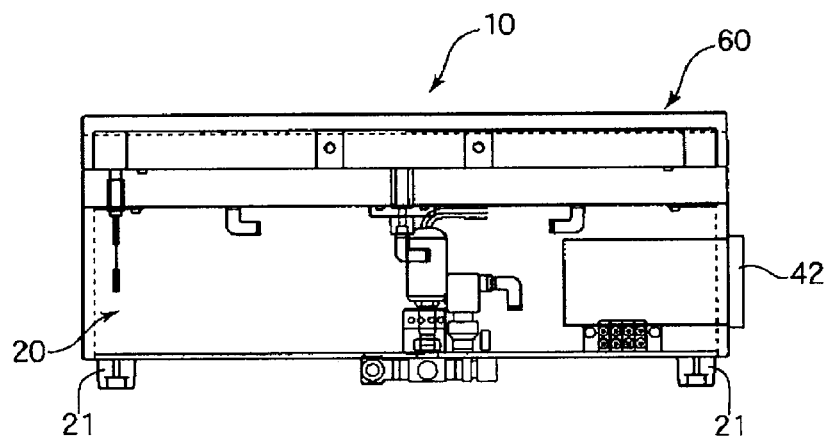
FIG. 5(b) is a view showing the configuration of the tape bonding device shown in FIG. 1, and a principal and sectional view of a state in which the cover body section is closed, seen from the side of the front surface.

Here, in a state in which the cover body section 60 is lowered to the main body section 20 to form a closed state (a state shown in FIG. 2, FIG. 3, and FIG. 5(b)), a locking mechanism for locking between the cover body section 60 and the main body section 20 may be provided (the locking mechanism is not provided in the present embodiment). When the above locking mechanism is provided, one component of the locking mechanism is installed on the cover body section 60, and the other component is installed on the main-body top-surface section 22. Moreover, when the locking mechanism is provided, the mechanism is provided at a location remote from the hinges 61.

Moreover, a portion of the cover body section 60 which applies against the seal ring 24 of the main body section 20 is a ring applied section 63, as shown in FIG. 2 and FIG. 3. The ring applied section 63 seals the first vacuum chamber 50 by applying against the seal ring 24. Furthermore, in order to realize preferable sealing, the ring applied section 63 includes a plate-like portion forming one plane in the present embodiment.

As shown in FIG. 3 and FIG. 4 a concave section 64 is formed on the cover body section 60 at a location which is on an opposing surface opposing to the main body section 20 and inner than the inside diameter side of the ring applied section 63. The above concave section 64 is formed in a hollow state in which the section 64 is lowered from the ring applied section 63. The above concave section 64 has a size corresponding to the above-described inside diameter section 22a. Consequently, when the cover body section 60 is closed and the seal ring 24 is applied against the ring applied section 63 to form a sealed state, there is generated a space enclosed with the above concave section 64, the seal ring 24, the inside diameter section 22a, and the rubber sheet 25. And, the above space becomes the first vacuum chamber 50.

Moreover, the bottom surface (hereinafter, called upper bottom surface 64a) located in the upper portion of the concave section 64 becomes a portion which prevents the tape member 12 from moving upward (receives the tape member 12 moving upward) when the rubber sheet 25 is expanded. Consequently, the depth of the concave section 64 is set in such a way that the above tape member 12 may be received and may be preferably bonded to the wafer 11.

Moreover, a handle 65a is installed at a portion opposing to the hinge 61 on the sidewall portion of the cover body section 60. Therefore, an operator may easily open and close the cover body section 60 by holding the handle 65a. Moreover, a total of four handles 65b are provided on the sidewall portions of the main body section 20 in such a way that the four handles form two pairs of handles, and two handles as one pair are opposing to each other. The tape bonding device 10 may be easily moved by holding the handle 65b.

Moreover, the controlling device 70 as a controlling unit is provided in the tape bonding device 10 as shown in FIG. 3. As described above, the controlling device 70 is electrically connected to the vacuum pump 36, the first and the second valve members 37 and 41, the sensor 43, and the vacuum gage 42. Control buttons for ON operation (not shown) are coupled to the above controlling device 70. Consequently, when the operator pushes a control button under a state in which the sensor 43 permits ON operation by closing the cover body section 60, the vacuum pump 36 operates. When the first vacuum chamber 50 or the second vacuum chamber 51 reaches a predetermined degree of vacuum by operating the above vacuum pump 36, the controlling device 70 gives a control signal to the first valve member 37 or the second valve member 41 in such a way that the member 37 or 41 is switched to the air introducing side.

Here, the controlling device 70 gives control signals to each of the first and the second valve members 37 and 41 in such a way that vacuum suction of the second vacuum chamber 51 is performed only for predetermined time, while maintaining a state in which the member 41 is switched to the suction side in the first place and, at the same time, member 37 is switched to the air introducing side. Then, the control signal is given to the first valve member 37 after a lapse of the predetermined time, and the member 37 is switched from the air introducing side to the suction side to perform vacuum suction of the first vacuum chamber 50, and, at the same time, the second vacuum chamber 51.

Moreover, the controlling device 70 gives a control instruction for switching to the air introducing side to the second valve member 41 when the first vacuum chamber 50 and the second vacuum chamber 51 reach the predetermined degree of vacuum. Thereby, bonding of the wafer 11 and the tape member 12 is started. Moreover, after the predetermined time has passed from the above state to complete the bonding, the controlling device 70 gives a control instruction for switching the first valve member 37 to the air introducing side. Both the first and the second vacuum chambers 50 and 51 reach a state, in which the pressure is equal to the atmospheric pressure, by the above switching to complete the bonding operation.

Here, one example of the above-described degree of vacuum is about 20 Pa. However, the predetermined degree of vacuum is not limited to the above value. Any degree of vacuum which is lower than the atmospheric pressure may be applied. Moreover, the controlling device 70 may have a configuration in which a control instruction is given to the vacuum pump 36 after completing bonding in such a way that the first valve member 37 is switched to the air introducing side, and the vacuum pump 36 is stopped. However, in this case, sucking time for the subsequent vacuum suction becomes somewhat longer in comparison with a case in which operation of the vacuum pump 36 is continued.

Action (operation) of the tape bonding device 10 with the above-described configuration will be explained hereinafter. Moreover, the action (operation) will be executed based on an operation flow shown in FIG. 6.

In the first place, the operator stretches the tape member 12 on the tape frame 28. In this case, the tape member 12 is stretched under a state in which the adhesive surface of the member 12 is turned downward. The tape member 12 is stretched on the tape frame 28 under a constant tension, and the tape frame 28 is set up on the pressing ring 26 thereafter (step S10). In this case, the tape frame 28 is set up on the pin member 27 of the pressing ring 26 in such a way that the positioning pin 29 is made to approach the notch section 31, and, at the same time, the locking pin 30 is located at the pin holding section 32. Setting up of the wafer 11 and the tape member 12 is completed under the above situation.

Subsequently, the cover body section 60 is lowered toward the main body section 20 until the sensor 43 detects that the cover body section 60 is closed (step S11). In this case, the operator may press the cover body section 60 downward within a predetermined distance. Then, the controlling device 70 judges whether the sensor 43 detects that the cover body section 60 is closed by the above lowering (step S12). Then, when the sensor 43 detects the closed state, the vacuum pump 36 may be operated after the controlling device 70 permits operation of the vacuum pump 36, and the operator pushes the control button.

When the operator pushes the control button, the controlling device 70 detects the above pushing, and gives an instruction for operation to the vacuum pump 36. Thereby, the vacuum pump 36 is operated and vacuum suction of the first and second chambers 50 and 51 is performed (corresponding to the sucking step). In this case, the second valve member 41 is switched to the suction side in the first place, and, at the same time, the first valve member 37 is switched to the air introducing side to perform vacuum suction of only the second vacuum chamber 51 (step S13). Then, after the above vacuum suction of the second vacuum chamber 51 is performed for a predetermined time, the first valve member 37 is switched from the air introducing side to the suction side, and vacuum suction of both the first vacuum chamber 50 and the second vacuum chamber 51 is performed (step S14).

Here, there is provided no locking mechanism in the present embodiment. However, when the vacuum pump 36 is operated, and the pressure of the first vacuum chamber 50 and that of the second vacuum chamber 51 are lower than the atmospheric pressure, the atmospheric pressure is given from the surroundings of the tape bonding device 10. Thereby, the degree of adhesion between the seal ring 24 and the ring applied section 63 is improved. Accordingly, the first and the second vacuum chambers 50 and 51 may be securely closed, not depending on the locking mechanism.

When the vacuum pump 36 performs vacuum suction for the predetermined time, the vacuum gage 42 detects that the first vacuum chamber 50 and the second vacuum chamber 51 have reached the predetermined degree of vacuum (step SI 5: corresponding to a vacuum achievement detecting step). When the above vacuum gage 42 detects the predetermined degree of vacuum, the gage 42 transmits a predetermined detecting signal to the controlling device 70. Then, the controlling device 70 switches the second valve member 41 to the air introducing side while the vacuum pump 36 kept being operated (step S16: corresponding to a first air introducing step). Thereby, the air is introduced into the second vacuum chamber 51 through the protruded tube section 40a.

When the air is introduced into the second vacuum chamber 51, the rubber sheet 25 expands toward the first vacuum chamber 50 according to difference in pressure between the side of the first vacuum chamber 50 and that of the second vacuum chamber 51. In this case, the wafer 11 is raised by expanding the rubber sheet 25, and the upper surface of the wafer 11 makes contact with tape member 12. Then, bonding of the tape member 12 to the upper surface of the wafer 11 is started (step S17: corresponding to the bonding step).

Figure 7A:
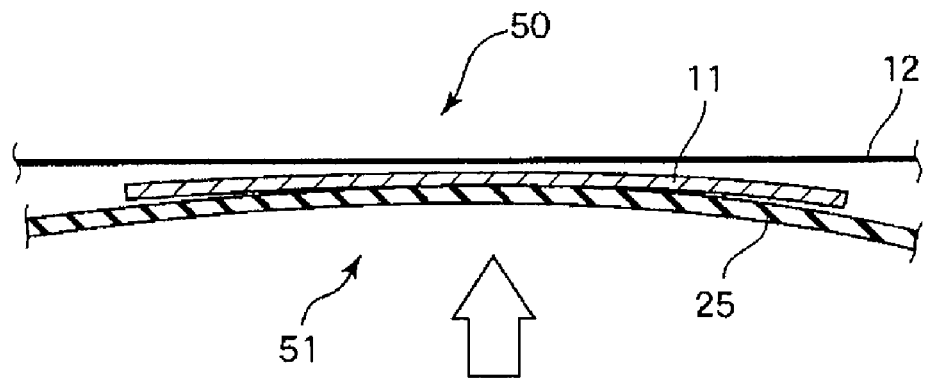
FIG. 7(a) is a view of an image showing a bonding mode for a case in which a wafer is raised and bonded to the tape member, using the tape bonding device shown in FIG. 1, and bonding is started from the center portion of the wafer to the tape member.
Figure 7B:
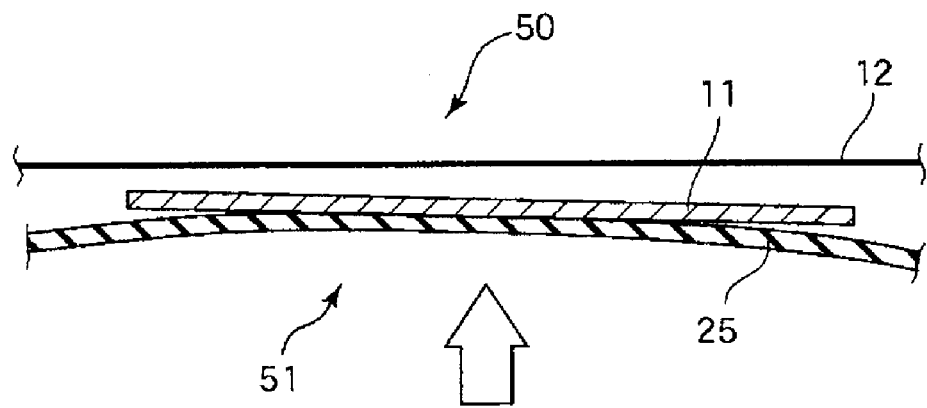
FIG. 7(b) is a view of an image showing a bonding mode for a case in which a wafer is raised and bonded to the tape member, using the tape bonding device shown in FIG. 1, and bonding is started from the upper end of the wafer which is inclined to the tape member.

Here, there are two modes for bonding between the upper surface of the wafer 11 and the tape members 12 as shown in FIG. 7(a) and FIG. 7(b). In the first place, a first mode is a case in which the wafer 11 is bonded to the tape member 12 from an approximately central portion on the upper surface of the above wafer 11 under a state, in which the wafer 11 is in parallel with the tape member 12 with no inclination relative thereto as shown in FIG. 7(a). In this case, bonding is started from the central portion of the tape member 12 because the central portion of the tape member 12 is slightly slackened downward under its own weight, and the peripheral portion of the wafer 11 is slightly bent to the central portion of the wafer 11 when the wafer 11 is gradually raised as the rubber sheet 25 is expanded.

Then, bonding is gradually started from the center of the tape member 12 to the peripheral portion as the wafer 11 is gradually raised. Furthermore, when the wafer 11 is raised as the rubber sheet 25 is expanded, the wafer 11 makes contact with the above tape member 12 while resisting the tension of the tape member 12 stretched on the tape frame 28. Moreover, as the wafer 11 makes contact with the tape member 12 while resisting the above tension, bonding may be prevented from being executed under a state in which bubbles are embedded between the bonded surfaces, wherein the member 12 is slackened to cause the embedded bubbles. Accordingly, there may be obtained preferable bonding between the wafer 11 and the tape member 12.

Here, when the wafer 11 is raised within a predetermined distance, the upper surface of the tape member 12 applies against the upper bottom surface 64a, and the member 12 does not move upward any more. Therefore, while the tape member 12 is pressed downward, the wafer 11 is raised upward while resisting the tension of the tape member 12. Thereby, bonding is surely executed from the central portion toward the peripheral portion. Furthermore, when a predetermined time has passed, maintaining the above state, bonding between the wafer 11 and the tape member 12 is surely executed.

According to the above-described bonding mode, bonding between the upper surface of the wafer 11 and the tape member 12 is executed while air is removed outward from the central portion of the wafer 11 (tape member 12). Here, the vacuum pump 36 continues vacuum suction of the first vacuum chamber 50 in this bonding mode. Consequently, bonding between the wafer 11 and the tape member 12 is preferably executed by removing air existing between the upper surface of the wafer 11 and the tape member 12 along with the above-described bonding mode.

Moreover, a second bonding mode is a case in which the wafer 11 is bonded to the tape member from the highest portion (hereinafter, called an upper end) on the above inclined wafer 11 in a state in which the wafer 11 is inclined with respect to the tape member 12 as shown in FIG. 7(b). In this case, bonding of the wafer 11 to the tape member 12 is started from the upper end on the inclined wafer 11 in the first place. Even in this case, the wafer 11 makes contact with the above tape member 12 while resisting the tension of the tape member 12 stretched on the tape frame 28, when the wafer 11 is raised as the rubber sheet 25 is expanded.

In the state, when the wafer 11 is raised while resisting the tension of the tape member 12 as the rubber sheet 25 is gradually expanded, the wafer 11 may be pivoted about a contacted portion between the wafer 11 and the above tape member 12 to gradually reduce the angle of inclination.

Here, when the upper end of the wafer 11 is raised within a predetermined distance while resisting the tension of the tape member 12, the upper surface of the tape member 12 applies against the upper bottom surface 64a even in this bonding mode. And the member 12 does not move upward any more. When the rubber sheet 25 is gradually expanded under the above state, the above wafer 11 is raised under a state in which the inclination angle of the wafer 11 is gradually reduced because the movement of the upper end of the wafer 11 is controlled by the upper bottom surface 64a. Then, the raising of the above wafer 11 is continued until the angle of inclination of the wafer 11 becomes 0. Here, when a predetermined time has passed after the angle of inclination of the wafer 11 becomes 0, bonding between the wafer 11 and the tape member 12 is surely executed.

According to the above-described bonding mode, bonding between the upper surface of the wafer 11 and the tape member 12 is executed while air is removed from the upper end of the wafer 11 (tape member 12) toward the end portion on the other side. Here, the vacuum pump 36 continues vacuum suction of the first vacuum chamber 50 even in this bonding mode. Consequently, bonding between the wafer 11 and the tape member 12 is preferably executed by removing air existing between the upper surface of the wafer 11 and the tape member 12 along with the above-described bonding mode.

As described above, the controlling device 70 continues switching of the second valve member 41 to the air introducing side for a predetermined time on the way described above while continuing switching of the first valve member 37 to the suction side (step S18). Thereby, bonding between the wafer 11 and the tape member 12 is surely executed. When the controlling device 70 judges at the step S18 that the predetermined time has passed, the controlling device 70 switches the first valve member 37 to the air introducing side (step S19: corresponding to a second air introducing process). Thereby, the air is introduced into the first vacuum chamber 50 to release the expanded state of the rubber sheet 25. Consequently, the wafer 11 is lowered while the upper surface of the wafer 11 is bonded to the tape member 12.

Moreover, when the first valve member 37 is switched to the air introducing side at the step S19, a state in which the operation of the vacuum pump 36 is continued is maintained. Thereby, quick response to the subsequent bonding operation for the wafer 11 may be realized. However, the above operation may be configured to be stopped.

The operator opens the cover body section 60 thereafter. Then, the operator takes out, for each of the tape frames 28, the wafer 11 to which the tape member 12 is bonded (step S20). Bonding of the tape member 12 to the upper surface of the wafer 11 is completed on the way described above.

Moreover, after the bonding of the tape member 12 to the upper surface of the wafer 11 has been completed, the process proceeds to the subsequent steps, for example, dicing processing.

According to the tape bonding device 10 with the above-described configuration, bonding of the tape member 12 to the upper surface of the wafer 11 may be realized, using expansion of the rubber sheet 25. Consequently, bonding of the tape member 12 to the upper surface of the wafer 11 may be surely realized, using the difference in pressure between the atmospheric pressure and the vacuum state though the device 10 has a simple configuration. Especially, the attitude of the wafer 11 may be easily corrected by elastic deformation of the rubber sheet 25 even when the wafer 11 is in so-called partial contact with the tape member 12 by use of the rubber sheet 25. Consequently, there may be obtained preferable bonding of the tape member 12 to the upper surface of the wafer 11.

Moreover, the wafer 11 is mounted on the rubber sheet 25. Consequently, the influence of the slack of the above rubber sheet 25 may be removed in comparison with a case in which a work piece (wafer 11) is located on the lower surface of the rubber sheet 25. Therefore, as the influence of the slack is removed, there is no need to provide a configuration in which a large tension is given to the rubber sheet 25. Accordingly, the structure of the tape bonding device 10 may be simplified. Moreover, as the required tension given to the rubber sheet 25 may be reduced, man-hours of workers who manufacture the tape bonding device 10 may be reduced. Furthermore, when the rubber sheet 25 is pressed with the pressing ring 26, the airtightness may be improved.

Furthermore, as the expansion of the rubber sheet 25 is used, special configuration in which the wafer 11 is moved toward the tape member 12 located upward is not required. Consequently, the wafer 11 may be moved upward toward the tape member 12 by use of a simple configuration.

Moreover, when the rubber sheet 25 raises the wafer 11, and the above wafer 11 makes contact with the tape member 12, the wafer 11 makes contact therewith, resisting a state in which the tape member 12 is stretched on the tape frame 28. Consequently, a case in which, while the tape member 12 is slackened, the member 12 is bonded to the upper surface of the wafer 11 may be eliminated. Accordingly, bubbles may be prevented from being embedded in a bonded space between the upper surface of the wafer 11 and the tape member 12. Moreover, even when the central portion of the tape member 12 is expanded downward by the own weight of the member 12, contact of the member 12 with the wafer 11 is started from the center to obtain desirable contact. Therefore, preferable bonding may be realized.

Furthermore, as the controlling device 70 is connected to the vacuum pump 36, the first and the second valve members 37 and 41, the sensor 43, and the vacuum gage 42, the device 70 may control these components. Especially, the controlling device 70 makes the vacuum pump 36 operate for vacuum suction of the first and the second chambers 50 and 51, and, after the above vacuum suction, makes the second valve member 41 operate to the air introducing side for introducing the air into the second vacuum chamber 51. Thereby, the rubber sheet 25 may be expanded toward the first vacuum chamber 50, and, using expansion of the rubber sheet 25 from which slack is removed, the tape member 12 may be surely bonded to the upper surface of the wafer 11.

Moreover, the controlling device 70 switches the first valve member 37 to the air introducing side, and, at the same time, the second valve member 41 to the vacuum suction side for exhausting of the second vacuum chamber 51 in the first place, when vacuum suction of the first vacuum chamber 51 and the second vacuum chamber 50 is performed. Consequently, the pressure of the second vacuum chamber 51 is lower than that of the first vacuum chamber 50 at first. Therefore, the rubber sheet 25 is expanded toward the side of the second vacuum chamber 51 at the side of the lower surface. According to the above configuration, the rubber sheet 25 are not expanded toward the first vacuum chamber 50 at first. Consequently, the wafer 11 and the tape member 12 may be prevented from being bonded to each other before a stage at which the second valve member 41 is switched to the air introducing side.

Furthermore, the cover body section 60 is provided reopenable to the main body section 20. Consequently, the cover body section 60 may be pivoted about the hinge 61. Thereby, under a state in which the cover body section 60 is opened, the wafer 11 and the tape member 12 are easily set up, and the wafer 11 to which the tape member 12 is bonded may be easily taken out.

Moreover, the seal ring 24 is provided between the cover body section 60 and the main body section 20. Consequently, the space between the cover body section 60 and the main body section 20 may be made airtight by blocking. Consequently, when the vacuum pump 36 is operated, and the first and the second valve members 37 and 41 are switched to the vacuum suction side, the space between the cover body section 60 and the main body section 20 is made airtight by blocking even when there is caused small gap between the cover body section 60 and the main body section 20 at first, because, along with proceeding of suction operation, the pressure by the atmospheric pressure rises to strengthen the bonded state between the seal ring 24 and the ring applied section 63.

Furthermore, the concave section 64 depressed upward is formed in a state in which the above cover body section 60 is closed. Thereby, when the tape member 12 reaches a predetermined height, the tape member hits the upper bottom surface 64a, is pressed downward, and is raised upward by the wafer 11 to execute bonding in the raised state. That is, as the wafer 11 is raised upward and pressed against the upper bottom surface 64a while the tape member 12 is pressed with the surface 64a located upward, bonding between the wafer 11 and the tape member 12 may be made solid and reliable.

However, in some cases, the central portion of the cover body section 60, that is, approximately the center of the upper bottom surface 64*a* is bent toward the side of the wafer 11 because the cover body section 60 is strongly sucked at vacuum suction. In the above cases, the above bending acts in such a way that contact between the wafer 11 and the tape member 12 is made preferable.

Moreover, the sensor 43 is provided on the main-body top-surface section 22. Consequently, the above sensor 43 may detect that the cover body section 60 is closed relative to the main body section 20. Then, a detection signal based on the above detection is transmitted to the controlling device 70, and the vacuum pump 36 is not operated before the controlling device 70 receives the detection signal corresponding to the closed state. Consequently, only when the cover body section 60 is surely closed, vacuum suction may be performed to prevent useless use of the vacuum suction.

Moreover, even when a foreign substance is inserted between the cover body section 60 and the main body section 20 by mistake, the above foreign substance may be easily removed because the vacuum pump 36 is not operated. Consequently, damage may be prevented from being caused between the cover body section 60 and the main body section 20.

Furthermore, the tape frame 28 is installed above the pressing ring 26 through the pin member 27. Consequently, a gap may be generated between the tape frame 28 and the pressing ring 26. Then, the air existing in the space between the tape member 12 and the wafer 11 may be sucked and exhausted from the above gap by operating the vacuum pump 36. Therefore, when the tape member 12 is bonded to the upper surface of the wafer 11, bubbles may be prevented from being embedded in the above bonded portion.

SECOND EMBODIMENT

Figure 8:
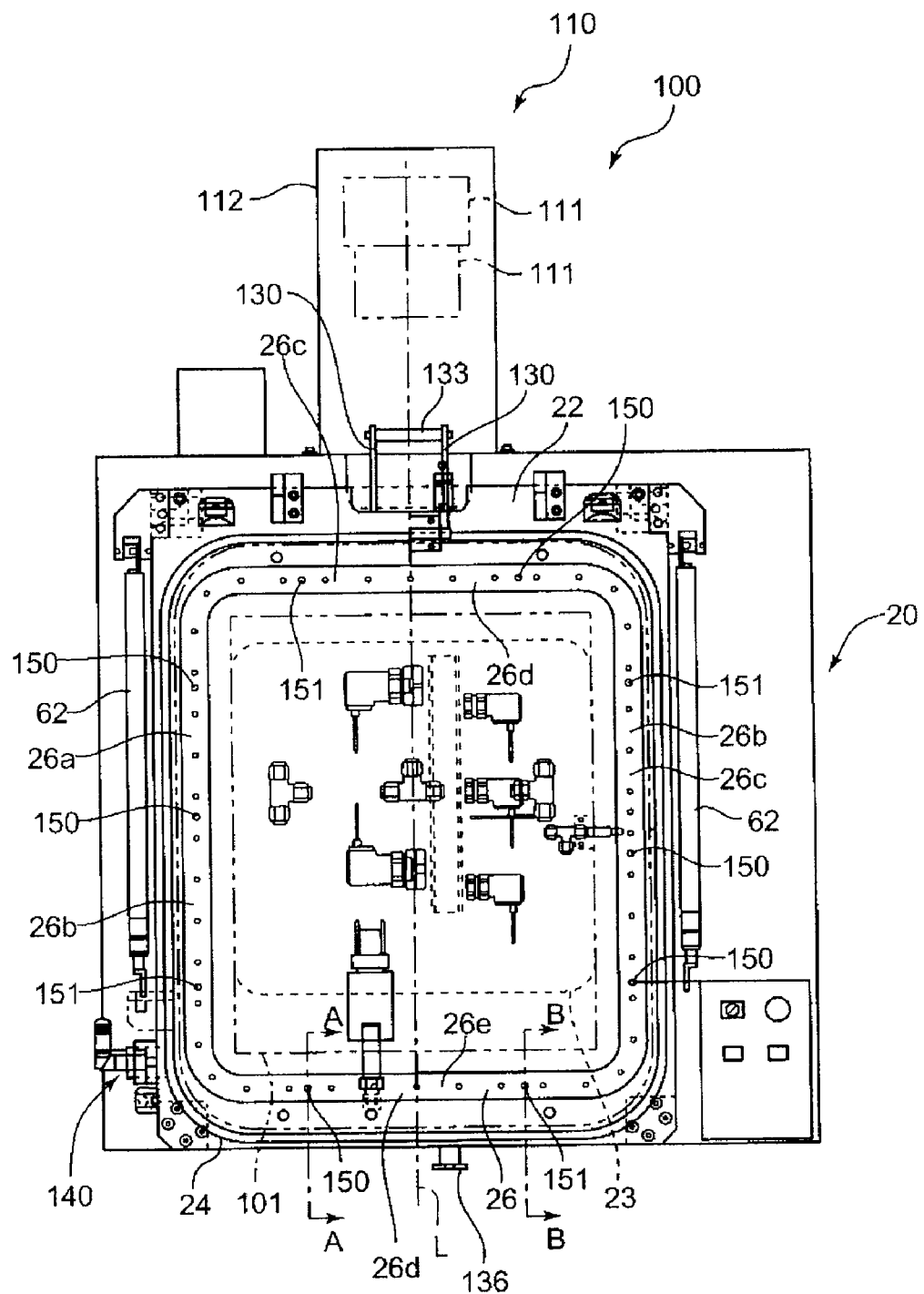
FIG. 8 is a view showing the configuration of the tape bonding device according to the second embodiment of the present invention, and a perspective plan view of the cover body section.
Figure 9:
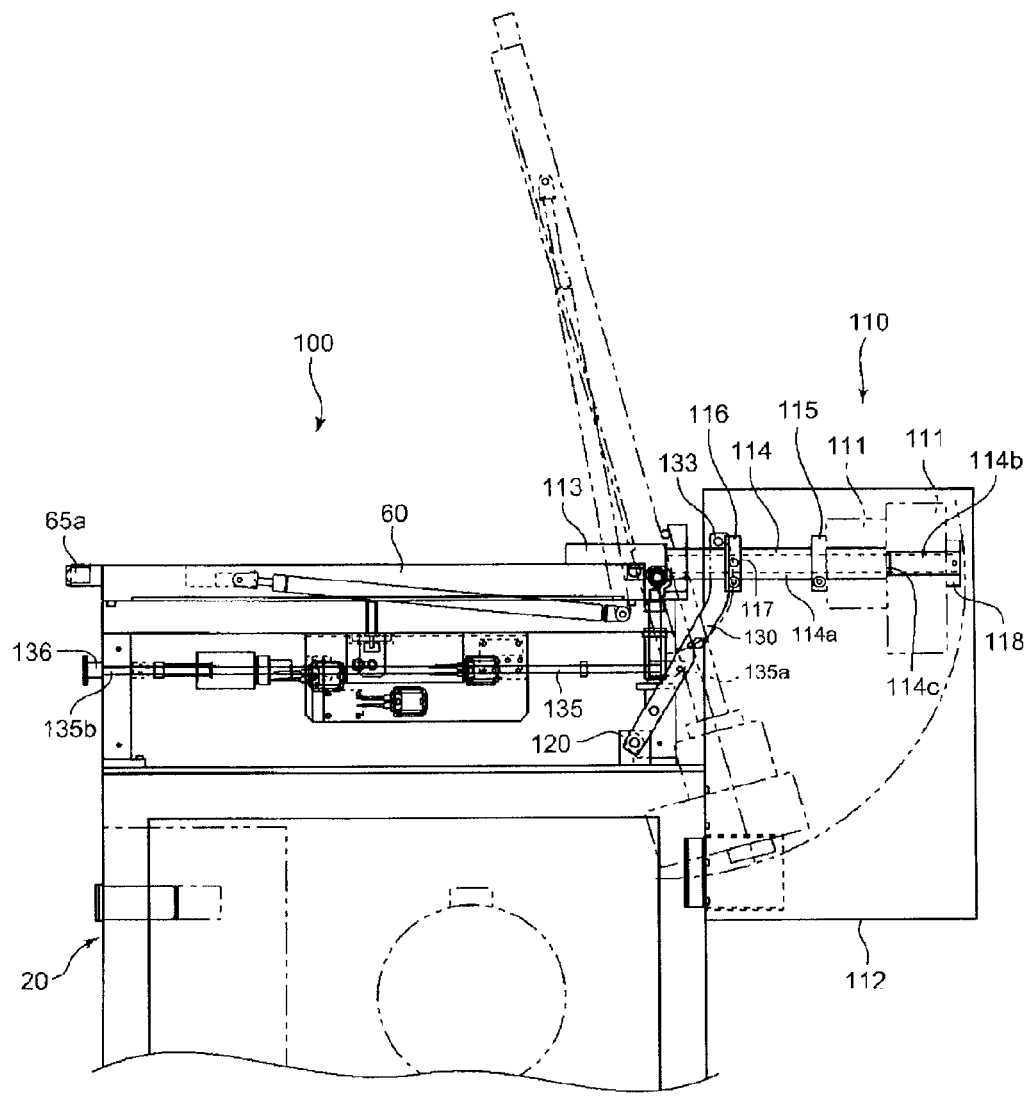
FIG. 9 is a view showing the configuration of the tape bonding device showing in FIG. 8 under a state in which the cover body section is closed, and a perspective side view of a part of the internal configuration.
Figure 10:
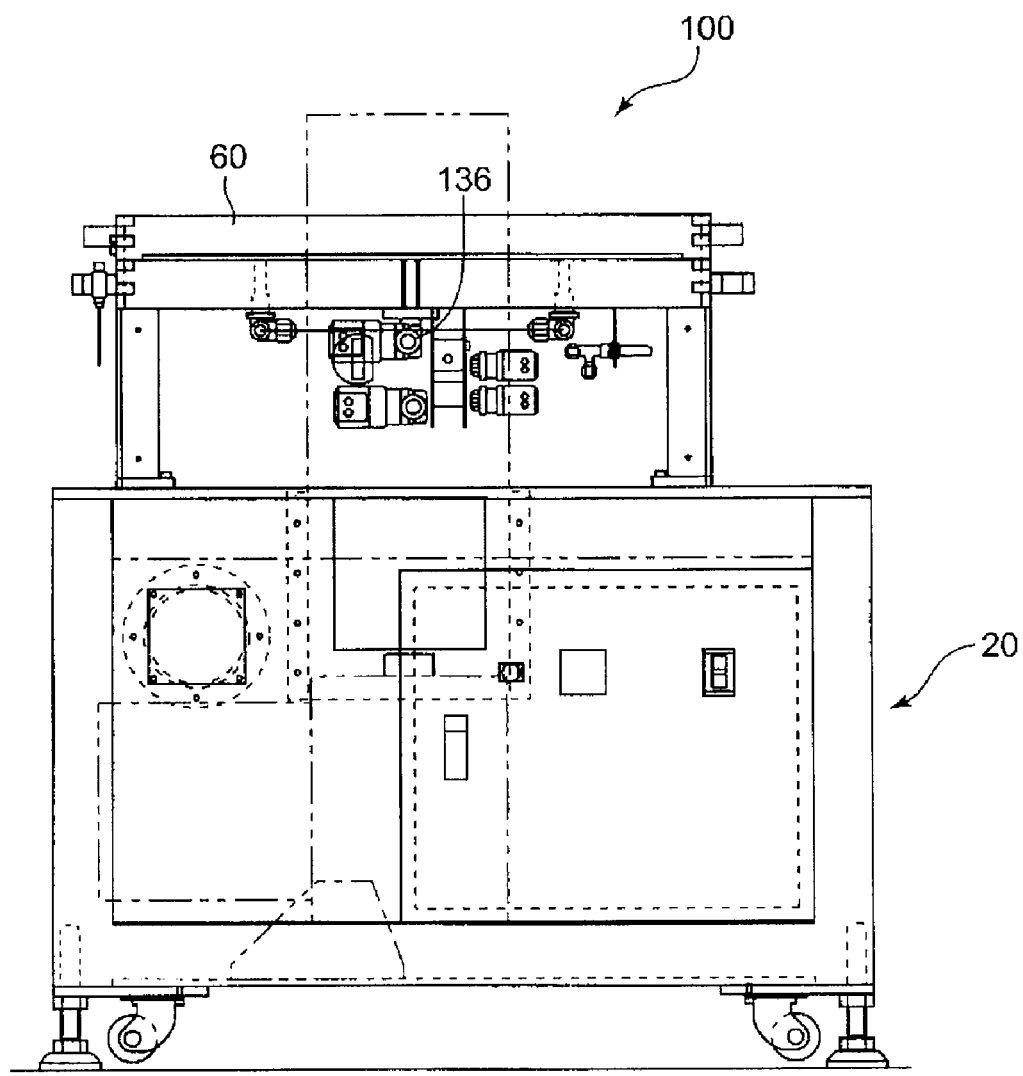
FIG. 10 is a front view showing the configuration of the tape bonding device showing in FIG. 8.
Figure 11:
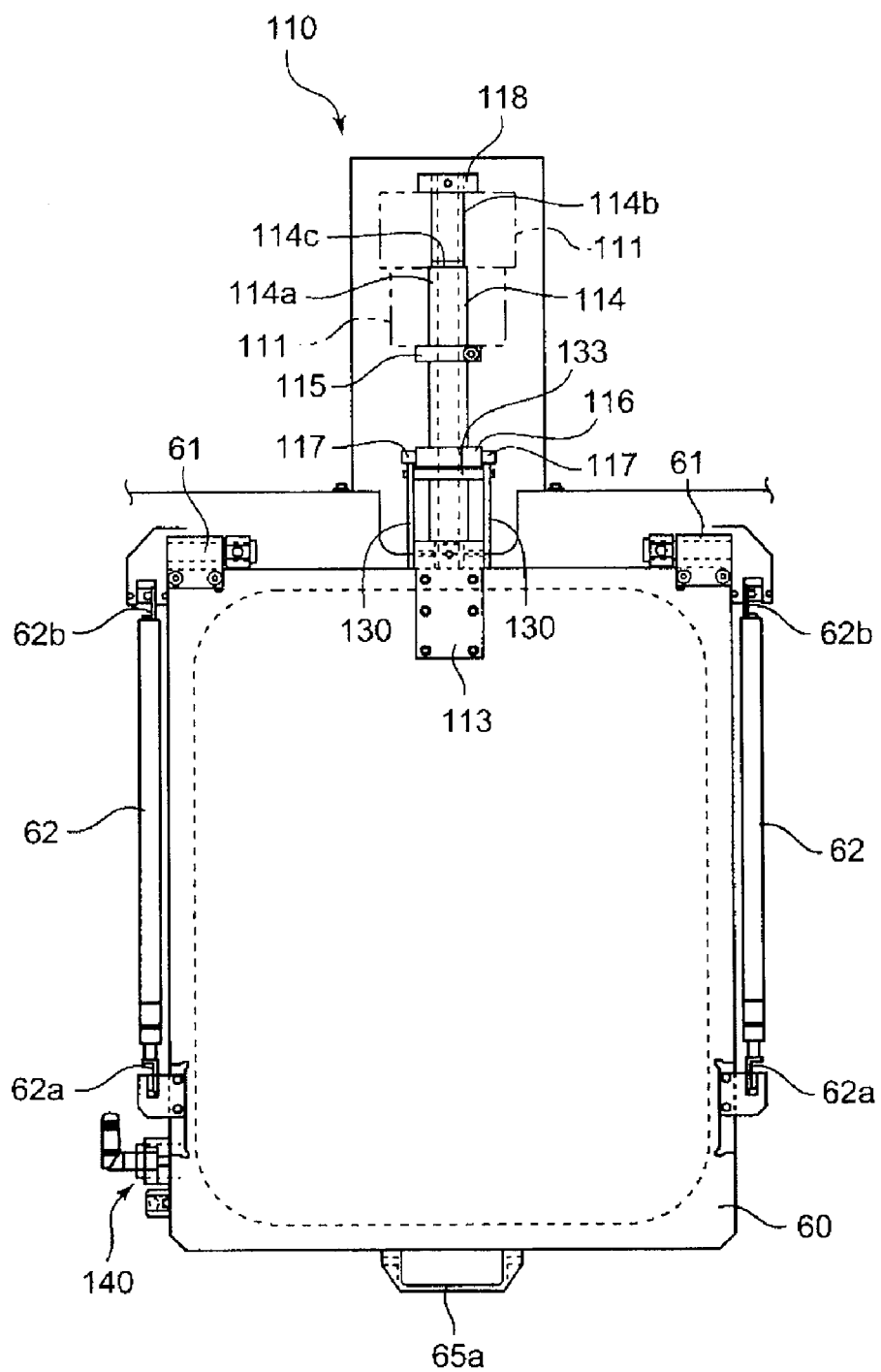
FIG. 11 is a plan view showing the configuration, centering on the cover body section in the tape bonding device shown in FIG. 8.

Hereinafter, the second embodiment according to the present invention will be explained, referring to FIG. 8 through FIG. 14. FIG. 8 shows a tape bonding device 100 according to the present embodiment, and, at the same time, is a plan view of a main body section 20 seen through a cover body section 60 shown in FIG. 11. Moreover, FIG. 9 is a perspective side view of the internal configuration of a part of components (release lever 135 and the like) of the tape bonding device 100. Moreover, FIG. 10 is a frontal view showing the configuration of the tape bonding device 100. Moreover, FIG. 11 is a plan view showing the configuration of the tape bonding device 100, centering on the cover body section 60 and a balancer mechanism 110.

The tape bonding device 100 according to the present embodiment uses a glass substrate 101 as a work piece, and a tape member 12 is bonded on the upper surface of the above glass substrate 101. Therefore, the basic configuration of the tape bonding device 100 is similar to that of the tape bonding device 10 in the above-described first embodiment. Therefore, explanation of portions similar to those which have been explained in the above-described first embodiment will be eliminated.

Here, the tape member 12 bonded to the glass substrate 101 in the present embodiment is an ultraviolet-curing type UV tape (sheet) similar to that of the tape member 12 in the above-described first embodiment. Therefore, the tape member 12 is provided with a property by which, when ultraviolet light is irradiated after the bonding tape member 12 is bonded to the glass substrate 101, the tape member 12 is cured and is easily peeled off from the glass substrate 101. However, the tape member 12 is not limited to the ultraviolet-curing type one, and a polarizing film may be used as the tape member 12. Moreover, a polarizing plate which is functionally the same as the polarizing film may be used as the tape member 12. Moreover, the glass substrate 101 is a mother glass substrate used for, for example, a liquid crystal display, a plasma display, and the like, and is of a large size (for example, 25 inches through 35 inches, or more). However, the glass substrate 101 may be of a small size. Moreover, the plane shape of the glass substrate 101 is rectangular one in the present embodiment. However, the plane shape of the glass substrate 101 may be any other shapes such as a circular one, and an oval one, except the rectangular one.

As shown in FIG. 8 the plane shape of the tape bonding device 100 is provided to approximately be rectangular. That is, a main body 20, a main-body top-surface section 22, a hole section 23, a rubber sheet 25, the cover body section 60, a concave section 64, and the like are formed to be approximately rectangular. Moreover, a seal ring 24, a pressing ring 26, a tape frame 28, and the like are provided to be like a rectangular ring with a rounded corner portion. Similarly, the hole section 23 and the concave section 64, and the like are also provided to have a rectangular shape with a rounded corner portion.

Moreover, the main body 20 with an overall plane shape which is approximately rectangular is provided in the present embodiment as shown in FIG. 8. Therefore, the main body 20 is provided to have the main-body top-surface section 22 and the like with an approximately rectangular plane shape.

Moreover, the balancer mechanism 110 forming a part of an opening and closing auxiliary unit is provided in the tape bonding device 100 according to the present embodiment as shown in FIG. 9, FIG. 11, and the like. The balancer mechanism 110 is a mechanism which facilitates the opening and closing of the cover body section 60 which has a larger area and a heavier weight, corresponding to the glass substrate 101 with a larger area. The above balancer mechanism 110 is a mechanism which may install a weight 111 at a location on the side opposing to the cover body section 60 through a hinge 61 as shown in FIG. 11. Moreover, the balancer mechanism 110 is provided with a housing 112 having an approximately rectangular shape, and components such as the weight 111 and an installing shaft 114 are contained in the above housing 112.

Moreover, the balancer mechanism 110 has an installing and fixing section 113 as shown in FIG. 9 and FIG. 11. The installing and fixing section 113 is installed on the side of the upper surface and on the side of the rear end (on the side on which the hinges 61 are provided) of the cover body section 60, and in a region between a couple of hinges 61. Moreover, the installing shaft 114 is installed on the side of the rear end (side more distant from the cover body section 60) of the installing and fixing section 113. That is, the installing shaft 114 is installed on the cover body section 60 through the installing and fixing section 113. The installing shaft 114 has a large diameter section 114*a* and a small diameter section 114*b*. And, the weight 111 may be installed on each of the large diameter section 114*a* and the small diameter section 114*b*.

Moreover, a difference-in-level section 114*c* existing between the large diameter section 114*a* and the small diameter section 114*b* may receive the weight 111 installed on the small diameter section 114*b*. Here, in the present embodiment the weight 111 installed on the large diameter section 114*a* is lighter than the weight 111 installed on the small diameter section 114*b*. However, the weight of the weight 111 installed on the large diameter section 114*a* and that installed on the small diameter section 114*b* may be suitably selected.

Moreover, a collar 115 is installed at a location distant from the difference-in-level section 114c toward the cover body section 60 by a predetermined distance. The collar 115 is provided for determining an installing position of the above-described weight 111. Moreover, a color 116 is installed on the large diameter section 114a at a location distant from the collar 115 toward the cover body section 60 by a predetermined distance. A joint pin 133, which will be described later, engages the above collar 116. Moreover, an engaging pin 117 corresponding to a protruding portion is protruding from the outer peripheral surface of the collar 116 toward the side of the outside diameter. The engaging pin 117 is a portion which enters into a notch section 134 which will be described later. Moreover, the engaging pin 117 is extending substantially in parallel with the main-body top-surface section 22 in the present embodiment.

Moreover, a fastening ring 118 is installed at a tip portion of the small diameter section 114b. The fastening ring 118 is a member which maintains an installed state in which the weights 111 are not tripped from the installing shaft 114 even when the installing shaft 114 is pivoted according to opening and closing of the cover body section 60.

Figure 12:
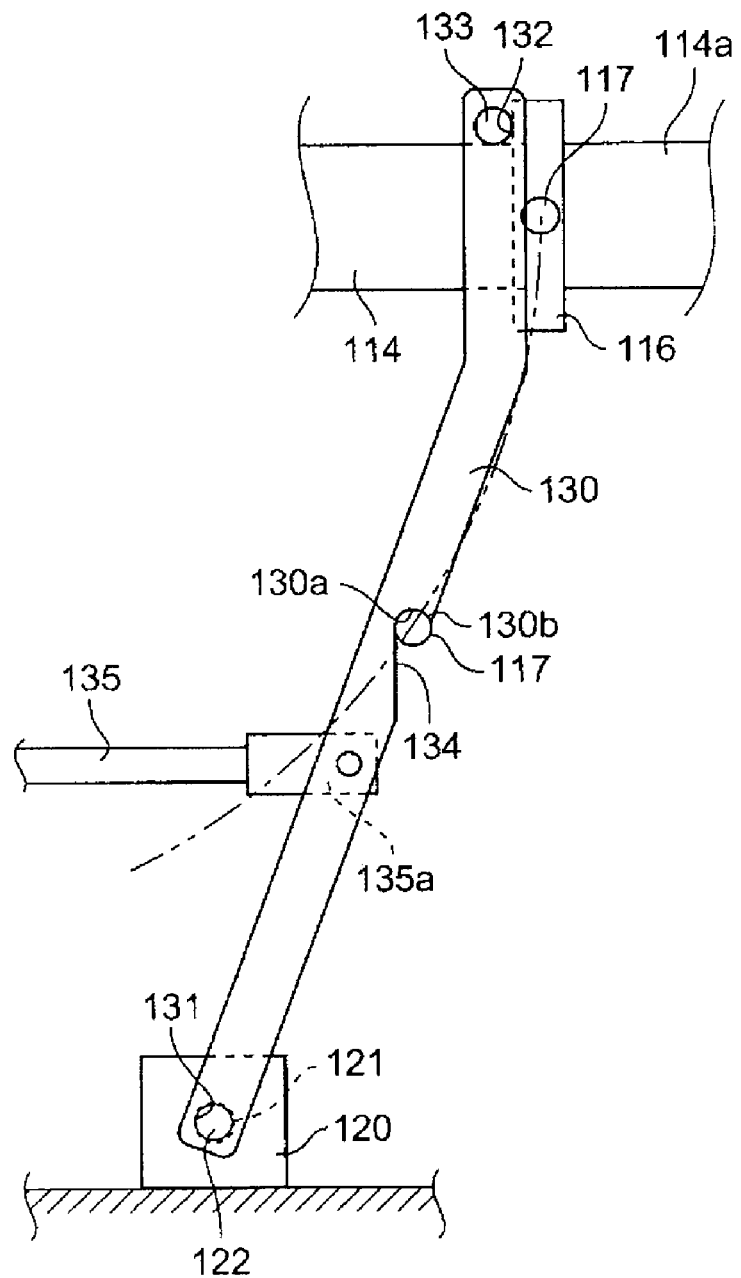
FIG. 12 is a partial side view showing the configuration in the vicinity of an arm in the tape bonding device shown in FIG. 8.

Moreover, as shown in FIG. 9 and FIG. 12, a supporting stand 120 forming a part of the opening and closing auxiliary unit is provided in the main body section 20, and a threading hole 121 through which a rotating shaft 122 threads is provided in the above supporting stand 120. The rotating shaft 122 pivotably supports an arm 130 forming a part of the opening and closing auxiliary unit. A shaft hole 131 is formed on the side of the lower end of the above arm 130, and the rotating shaft 122 threading through the threading hole 121 threads through the shaft hole 131. Thereby, the arm 130 is pivotably supported on the supporting stand 120. Moreover, in the present embodiment, a pair of the arms 130 are provided in such a way that the center line L (refer to FIG. 8) of the main body section 20 is sandwiched therebetween. Therefore, a pair of the supporting stands 120 are also provided in the main body section 20. Moreover, the rotating shaft 122 has a length by which the shaft 122 penetrates through both of the pair of the supporting stands 120.

FIG. 12 is a side view partially showing the configuration in the vicinity of the arm 130. As shown in FIG. 12, a pair of the arms 130 have an outer appearance that a shorter piece (an upper end portion in FIG. 12) of long and narrow plate members is curved at an obtuse angle with respect to the longer piece. The above-described shaft hole 131 is formed on the side (the side of the lower end) of one end of the above arm 130, and a through hole 132 is also formed on the side of the other end (the side of the upper end) of the arm 130. Here, the side of the upper end of the arm 130 provided with the through hole 132 is located upward from the installing shaft 114 under a state in which the cover body section 60 is closed. Moreover, a joint pin 133 stretching over both of the couple of arms 130 is inserted into the through hole 132. Both of the pair of the arms 130 may be pivoted as one body by the existence of the above joint pin 133.

Here, the joint pin 133 runs between both of the pair of the arms 130 on the upper side of the installing shaft 114 in such a way that the pin 133 stretches over both of the arms 130. Therefore, the joint pin 133 is always located above the installing shaft 114. Moreover, the joint pin 133 engages the above-described collar 116 under a state in which the cover body section 60 is closed.

Furthermore, the notch section 134 is provided in the arm 130 as shown in FIG. 12. The above notch section 134 is provided in the approximately central portion of the arm 130. In FIG. 12, the notch section 134 is notched from the side surface on the rear end of the arm 130 (the side more distant from the cover body section 60), and, at the same time, is carved from the lower side to the upper side. Thereby, the arm 130 has a configuration in which there exists a lower protruding section 130b located below the top portion 130a of the notch. Consequently, the engaging pin 117 enters into the notch section 134, and the movement of the above engaging pin 117 to the side of the rear end is restricted by the existence of the lower protruding section 130b. Thereby, a state in which the engaging pin 117 enters into the notch section 134 may be maintained to maintain a state in which the cover body section 60 is opened.

Moreover, the side 135a of one end of the release lever 135 is coupled to the arm 130 as shown in FIG. 9 and FIG. 12. The side 135a of one end of the release lever 135 is coupled at a location on the lower side of the notch section 134 in the arm 130. Moreover, the side 135b of the other end of the release lever 135 is protruding from the side surface on the near side on the main body section 20. A holding section 136 with a flange section is installed at the side 135b of the other end. Therefore, the arm 130 may be pivoted around the rotating shaft 122 to the near side by pulling the holding section 136 to the near side. Moreover, engagement of the above engaging pin 117 with the notch section 134 may be released by pivoting the arm 130 to the near side, and, at the same time, by slightly lifting the cover body section 60 by hand under a state in which the engaging pin 117 is in engagement with the notch section 134.

Figure 13:
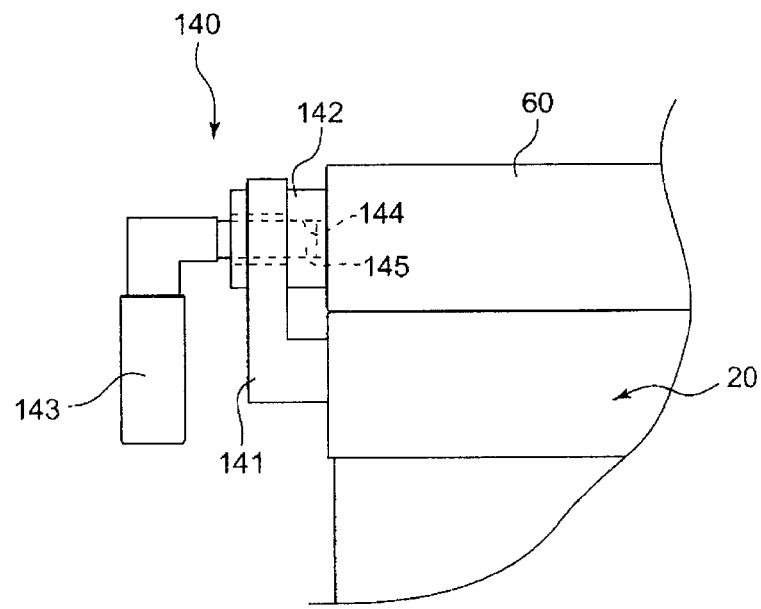
FIG. 13 is a partial side view showing the configuration in the vicinity of a locking mechanism in the tape bonding device shown in FIG. 8.

Moreover, a locking mechanism 140 as an opening-and-closing lock unit is provided in the tape bonding device 100 according to the present embodiment as shown in FIG. 8, FIG. 11, and FIG. 13. The locking mechanism 140 is a member which surely closes the cover body section 60. As shown in FIG. 13, the locking mechanism 140 has a receiving section 141 provided for the cover body section 60, a locking main body 142 provided for the main body section 20, and a lever section 143. With regard to the above components, a hole section 144 is formed in the receiving section 141. A locking pin 145 which will be described later enters into the hole section 144.

Moreover, the lever section 143 is provided in the locking main body 142. The locking pin 145 is provided for the lever section 143 in such a way that the pin 145 interlocks with the lever section 143. That is, when an operator holds the lever section 143, and rotates the above lever section 143 by, for example, about 180 degrees, the locking pin 145 enters into the hole section 144 on the side of the receiving section 141. Thereby, opening of the cover body section 60 is locked. Moreover, when the lever section 143 is rotated by, for example, about 180 degrees from a state in which the locking pin 145 enters into the hole section 144, the locking pin 145 which has entered into the hole section 144 is tripped from the section 144. Furthermore, various kinds of methods such as a method using screws, a method by which the energizing force of a spring is released by rotation, and a method using cams may be applied for entering the locking pin 145 into the hole section 144 and tripping the pin 145 therefrom.

Moreover, the method for entering the locking pin 145 into the hole section 144 and tripping the pin 145 therefrom is not required to be applied, and other methods such as a slide lock method may be used for the locking mechanism 140.

Figure 14:
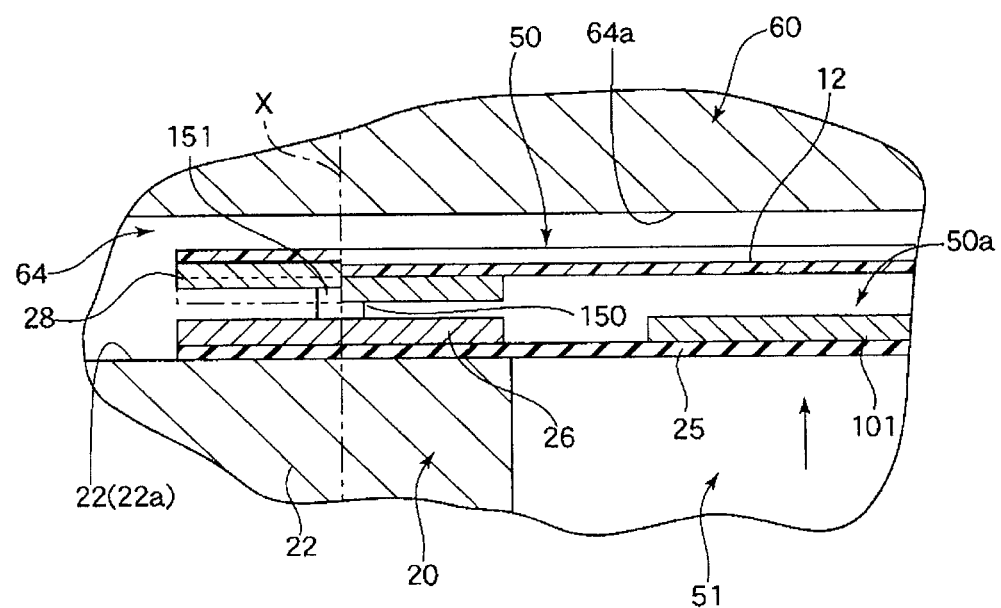
FIG. 14 is a half section view showing a configuration in which a sectional side view taken along the A-A line in FIG. 8 is arranged on the right side, a sectional side view taken along the B-B line in FIG. 8 is arranged in the left side, and the both sectional side views are linked together, assuming that the center line X of a short pin and a long one is a boundary line.

FIG. 14 is a half section view showing a configuration in which a sectional side view taken along the A-A line in FIG. 8 is arranged on the right side, a sectional side view taken along the B-B line in FIG. 8 is arranged on the left side, and the both sectional side views are linked together, assuming that the center line X of a short pin 150 and a long one 151 is a boundary line. As shown in FIG. 8 and FIG. 14, the short pin 150 as a pin member and a first supporting member, and the long pin 151 as a pin member and a second supporting member are provided on the pressing ring 26 in the present embodiment. The short pin 150 is a pin member which is directed upward from the upper surface of the pressing ring 26, and is protruding therefrom by about 1 mm. And, the long pin 151 is a pin member which is similarly directed upward from the upper surface of the pressing ring 26, and is protruding therefrom by about 1.7 mm.

However, the protruding lengths of the short pin 150 and that of the long pin 151 are not limited to the above lengths, and there may be applied any lengths determined by a configuration in which the length of the long pin 151 is longer than that of the short pin 150, and the tape member 12 makes contact with the upper bottom surface 64a at expansion of the rubber sheet 25 though the tape member 12 does not make contact with the upper bottom surface 64a at first.

Here, ten pins in total, including short pins 150 and long pins 151, are provided on the pressing ring 26 in the present embodiment (refer to FIG. 8). Among the above pins, three short pins 150 and three long pins 151 are provided on the left-side longer piece 26b and on the right-side longer piece 26c of the pressing ring 26, respectively. Moreover, two short pins 150 and two long pins 151 are provided on the upper-side shorter piece 26d and on the lower-side shorter piece 26e of the pressing ring 26, respectively. Furthermore, the long pin 151 is arranged in the lower portion, and the short pin 150 is arranged in the central portion and the upper portion on the left-side longer piece 26b. Moreover, the long pin 151 is arranged in the upper portion, and the short pin 150 is arranged in the central portion and the lower portion on the right-side longer piece 26c. In addition, the long pin 151 is arranged in the left side portion, and the short pin 150 is arranged in the right side portion on the upper-side shorter piece 26d, and, at the same time, the long pin 151 is arranged in the right side portion, and the short pin 150 is arranged in the left side portion on the lower-side shorter piece 26e.

When four long pins 151 thus arranged are connected, a parallelogram with almost a rectangular shape is formed.

Action (operation) of the tape bonding device 100 with the above-described configuration will be explained as follows. Here, as the action (operation) of the tape bonding device 100 is also basically similar to the operation of the tape bonding device 10 described in the above-described first embodiment, explanation of common portions will be eliminated, or briefly sketched.

In the first place, the operator mounts the glass substrate 101 on the upper portion of the rubber sheet 25. Subsequently, the tape member 12 is stretched on the tape frame 28. Thereafter, the tape frame 28 is set up on the pressing ring 26 (step S10: refer to FIG. 6).

In this case, the tape frame 28 is set up on the upper portion of the short pins 150 and the long pins 151 provided on the pressing ring 26, but, with regard to the tape frame 28, portions (portions applying against the short pin 150, and portions between the short pin 150 and the long pin 151), other than the vicinity of four locations applying against the long pin 151, are bent downward, based on difference in length between the short pin 150 and the long pin 151. Similarly, with regard to the tape member 12 stretched on the tape frame 28, portions other than the vicinity of four locations where the long pin 151 applies against the tape frame 28 are bent downward. On the way described above, setting up of the glass substrate 101 and the tape member 12 is completed.

Subsequently, the operator holds the holding section 136, and pulls the section 135 to the near side. In this case, it is preferable that the operator lightly pushes (pivots the section clockwise in FIG. 9) the cover body section 60 to the side of the rear end.

Then, as the arm 130 receives force toward the near side through the release lever 135, the above arm 130 is pivoted around the rotating shaft 122 toward the near side. At this time, the engaging pin 117 crosses over the side of the upper end of the lower protruding section 130b by slightly raising (by slightly pivoting the section clockwise in FIG. 9) the cover body section 60. Then, engagement of the engaging pin 117 with the notch section 134 is released. Thereby, the cover body section 60 may be pivoted (pivoted counterclockwise in FIG. 9) toward the closing direction.

Subsequently, the cover body section 60 is lowered toward the main body section 20 until the sensor 43 detects that the cover body section 60 is closed (step S11: refer to FIG. 6). Then, the lever section 143 in the locking mechanism 140 is rotated after the cover body section 60 is closed. Thereby, the locking pin 145 enters into the hole section 144, the ring applied section 63 (refer to FIG. 3) of the cover body section 60 is pressed against the seal ring 24, and, at the same time, the cover body section 60 is locked. Furthermore, the following steps are similar to those (refer to FIG. 6) described in the above-described first embodiment. Then, after completing the above steps, there may be obtained reliable bonding between the glass substrate 101 and the tape member 12 under a state in which bubbles are not embedded between the glass substrate 101 and the tape member 12.

According to the tape bonding device 100 with the above-described configuration, the tape member 12 may be bonded to the upper surface of the above glass substrate 101 by use of expansion of the rubber sheet 25 even when the glass substrate 101 is used as a work piece in a similar manner to that of the above-described first embodiment. That is, bonding of the tape member 12 to the upper surface of the glass substrate 101 may be surely realized, using the difference in pressure between the atmospheric pressure and the vacuum state though the tape bonding device 100 has a simple configuration.

Moreover, the balancer mechanism 110 is provided in the tape bonding device 100. Therefore, operation by which the operator opens and closes the cover body section 60 may be made easier to reduce the load of the operator. Especially, as the balancer mechanism 110 is provided with the installing shaft 114, and the weight 111 is installed on the above installing shaft 114, weight balancing between the cover body section 60 and the weight 111 through the hinges 61 may be realized. Therefore, opening and closing operation of the cover body section 60 is made further easier.

Moreover, the balancer mechanism 110 is provided with the arm 130, and the notch section 134 which the engaging pin 117 engages is provided in the above arm 130. Consequently, when the cover body section 60 is opened, and the engaging pin 117 enters into the notch section 134 and is stopped therein, the engaging pin 117 is prevented by the existence of the lower protruding section 130b from tripping from the above notch section 134, and the entered state of the pin is maintained. Thereby, pivoting of the arm 130 may be prevented to maintain the open state of the cover body section 60, and the operator is not required to maintain the open state of the cover body section 60 by pressing the cover body section 60 by hand, and the like. Therefore, the operator may perform other operations, and the tape bonding device 100 has excellent convenience.

Furthermore, the short pins 150 and the long pins 151 are provided on the pressing ring 26, and the tape frame 28 is supported by the above short pins 150 and the long pins 151.

Therefore, with regard to the tape member 12 fixed to the tape frame 28, the height is increased in the vicinity of supporting locations of the long pins 151, and the height is reduced in other portions. Therefore, using the long pins 151, the tape member 12 is prevented from making contact with the glass substrate 101, and, at the same time, the height of the tape member 12 may be reduced by providing the short pins 150 in comparison with a case in which the whole of the tape member 12 is supported with long pins 151. In this case, considering the bending of the tape member 12, extra space may be provided above the tape member 12.

Moreover, the depth of the concave section 64 existing in the cover body section 60 is not required to be increased to a depth deeper than a required quantity. Consequently, when there is a little extra space, the depth of the concave section 64 may be increased by, for example, cutting, and may be arbitrarily adjusted. That is, when the depth of the upper bottom surface 64a pressing the tape member 12 from the upper side is appropriately adjusted, preferable bonding between the glass substrate 101 raised by expansion of the rubber sheet 25 and the tape member 12 may be obtained.

Moreover, the locking mechanism 140 is provided in the tape bonding device 100 according to the above-described embodiment. Therefore, the cover body section 60 may be prevented from being opened during bonding of the tape member 12 to surely maintain a state in which the cover body section 60 is closed.

THIRD EMBODIMENT

Figure 15:
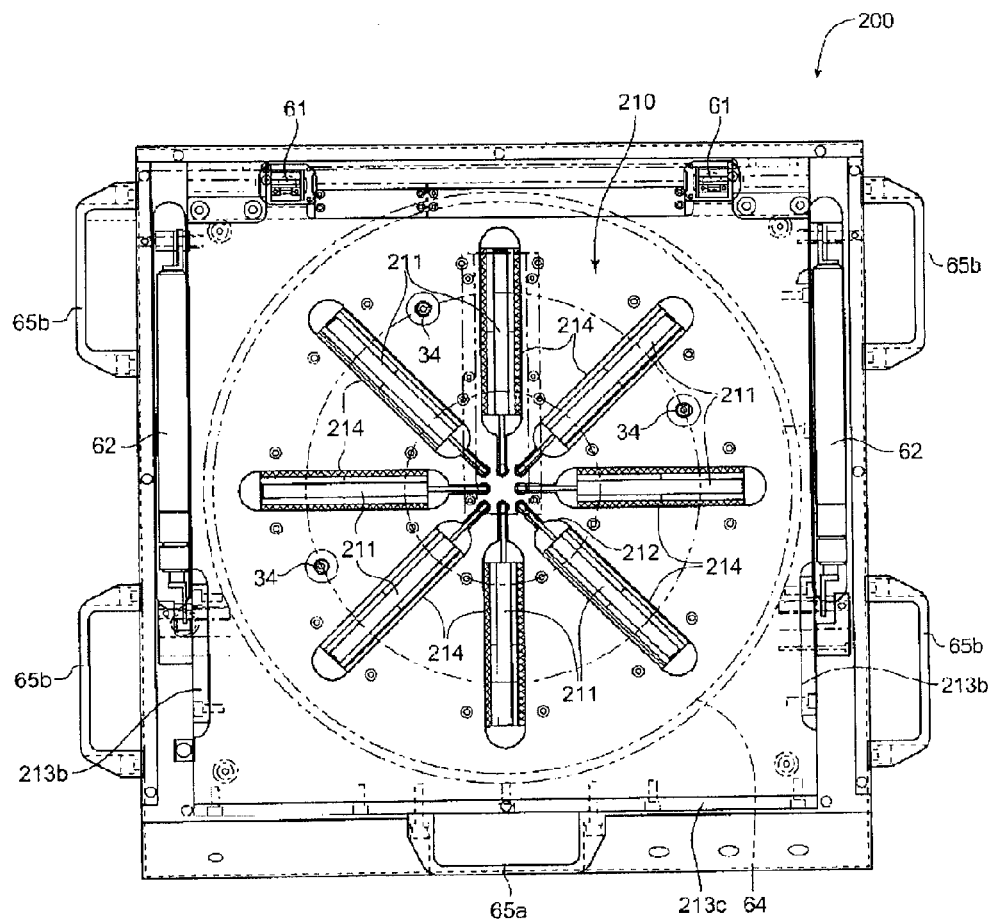
FIG. 15 is a view showing the configuration of a tape bonding device according to a third embodiment of the present invention, and a perspective plan view of the cover body section.
Figure 16:
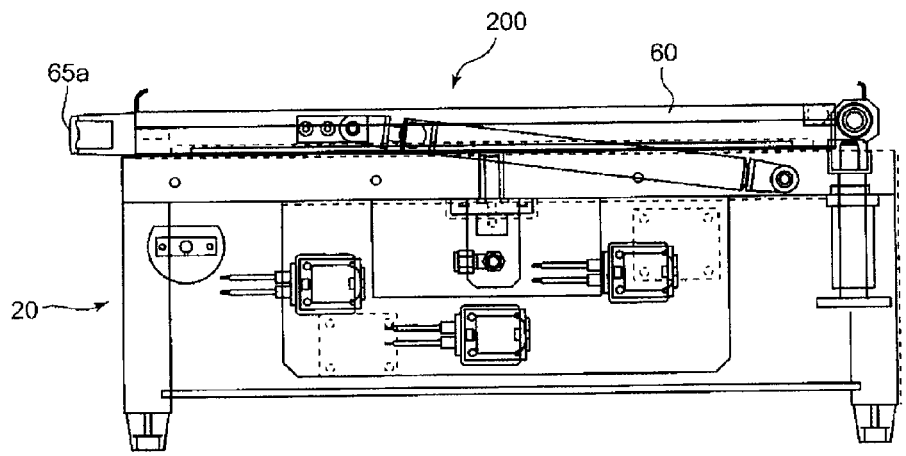
FIG. 16 is a view showing the configuration of the tape bonding device shown in FIG. 15, and a side view showing a state in which the cover body section is closed.
Figure 17:
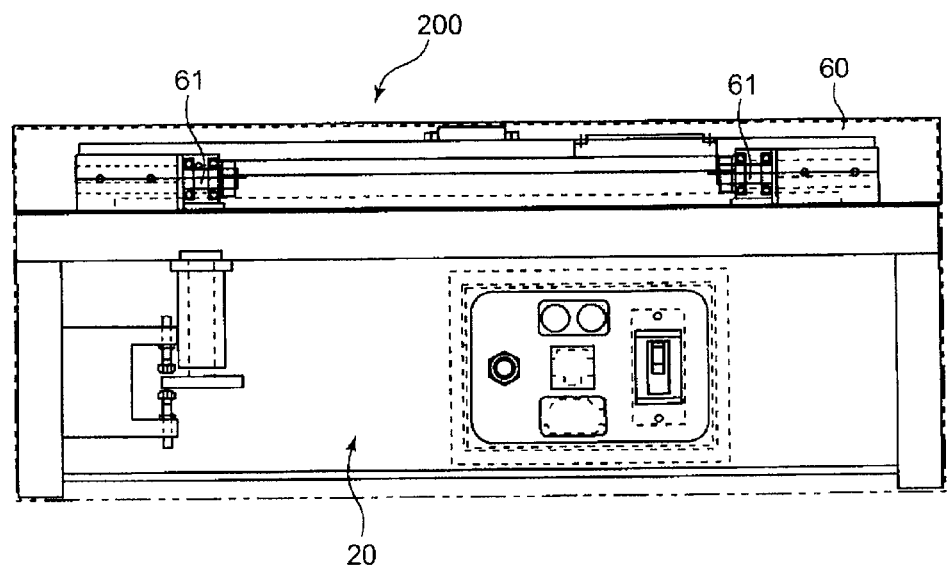
FIG. 17 is a rear view showing the configuration of the tape bonding device shown in FIG. 15.
Figure 18:
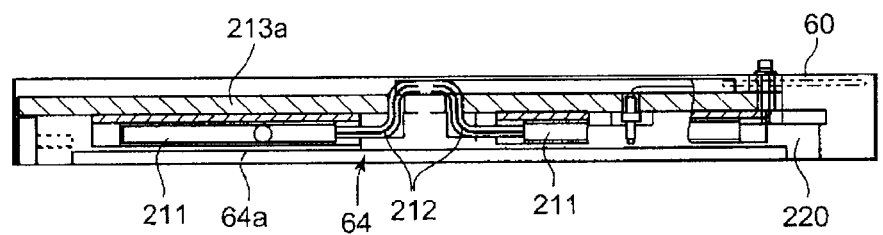
FIG. 18 is a perspective and side view showing the internal configuration of the cover body section in the tape bonding device shown in FIG. 15.

Hereinafter, the third embodiment according to the present invention will be explained, referring to FIG. 15 through FIG. 18. FIG. 15 is a plan view showing a state in which a cover body section 60 is seen from a main body section 20 in a tape bonding device 200 according to the present embodiment. Moreover, FIG. 16 is a perspective side view showing the internal configuration of a part of components (release lever, and the like) in the tape bonding device 200. Moreover, FIG. 17 is a rear view showing the configuration of the tape bonding device 200. Moreover, FIG. 18 is a perspective side view showing the internal configuration of the cover body section 60 in the tape bonding device 200.

The tape bonding device 200 according to the present embodiment is different from the tape bonding device 10 according to the above-described first embodiment in a point that the side of a cover body section 60 is changed. Moreover, a material (for example, a heat-hardening-type bonding agent) the adhesion property of which is improved by heating is spread over the bonded surface of a tape member 12. Therefore, a state in which the tape member 12 is easily bonded to a wafer 11 is caused by heating which will be described later. Hereinafter, the details will be explained.

It should be noted that the tape member 12 is not limited to a material over the surface of which a heat-hardening-type bonding agent is spread, and any tape member 12 the adhesion property of which is improved by heating may be applied.

As shown in FIG. 15, a heating unit 210 is included in the cover body section 60. The heating unit 210 gives heat to a concave section 64 existing in the cover body section 60, and heats the tape member 12 by radiant heat from the concave section 64, or by contact with the concave section 64. Therefore, the heating unit 210 is included at a location (an upper-side location adjacent to the concave section 64 in FIG. 18: hereinafter, the above location is called a storage section 220) in the vicinity of an upper bottom surface 64a of the concave section 64 in the cover body section 60. Moreover, the heating unit 210 has a plurality of heaters 211 (eight heaters in the present embodiment) as a heating means, and, at the same time, the plurality of heaters 211 are radially arranged from the center to the side of the outside diameter of the storage section 220 in the diameter direction.

Moreover, for example, a cartridge heater is used for the heater 211. However, the heater 211 is not limited to the cartridge heater, and various kinds of heaters such as a halogen heater and an infrared heater may be applied. Moreover, a sheath heater (for example, a seeds heater), other than the cartridge heater, may be applied.

The above heater 211 is installed through a separately fixed unit (for example, a cartridge holder 214 shown in FIG. 14) in the storage section 220. However, the fixed unit is not limited to the cartridge holder 214, and any type of fixing techniques may be applied. Moreover, interconnect lines 212 connected to the heaters 211 are located in the central portion of the storage section 220 (concave section 64) in the diameter direction and distant from the heaters 211. Moreover, the interconnect lines 212 are extending upward in the central portion of the storage section 220 (concave section 64) in the diameter direction as shown in FIG. 18. And, the interconnect lines 212 are extending toward the side of the outside diameter in a state in which the lines are located in the upper side of the cover body section 60 in such a way that the lines do not interfere with the heaters 211, and are connected to the power supply side (not shown) through a terminal stand (not shown).

As shown in FIG. 18, an insulating material 213a is installed on the side of the upper surface of the storage section 220. Moreover, an insulating material 213b is installed on the side 62a of one end of a damper member 62 (in the vicinity of a handle 65b on the near side) as shown in FIG. 15. Furthermore, an insulating material 213c is also installed on the near side (on the side of the handle 64a) of the tape bonding device 200. Thereby, the side of the upper surface of the cover body section 60, and the handles 65a and 65b which the operator often holds are prevented from being heated by the heaters 211.

Furthermore, the heaters 211 may heat the tape member 12 to about 70 degrees, and up to about 100 degrees at maximum in the present embodiment. However, the heating temperature by the heaters 211 is not limited to the above values, and the above bonded surface may be heated to about 200 degrees, depending on the kind of the heat-hardening-type bonding agent which is used for being spread over the bonded surface of the tape member 12.

Here, the procedure for bonding the tape member 12 to the wafer 11 is similar to that of the above-described first embodiment in the present embodiment, excluding the heating portions. That is, after the temperature of the heaters 211 reaches a temperature suitable for heating, steps similar to those of the above-described first embodiment are executed. Therefore, explanation of operations for bonding the tape member 12, using the tape bonding device 200 will be eliminated.

Moreover, a tape frame 28 in which the wafer 11 and the tape member 12 are installed is set up in the main body section 20 in the present embodiment, and, when the cover body section 60 is closed, the heating steps are automatically executed. In the above heating steps, a portion (plate-like upper bottom surface 64a) with a predetermined thickness is heated by the heaters 211, wherein the portion forms the concave section 64. That is, after the upper bottom surface 64a with a large area is heated and approximately a uniform temperature is obtained all over the above upper bottom surface 64a, the tape member 12 is heated by radiant heat from the upper bottom surface 64a. Therefore, there is obtained a state in which the tape member 12 is indirectly and uniformly heated through the above upper bottom surface 64a.

Moreover, the heaters 211 are always operated in the present embodiment, regardless of whether the cover body section 60 is opened or closed. However, depending on the heating temperature, there may be applied a configuration in which a sensor 43 detects a state in which the cover body section 60 is opened, and, when the detection signal is detected by a controlling device 70, the operation of the heaters 211 may be stopped.

In the tape bonding device 200 with the above configuration, preferable bonding (adhesiveness) of the tape member 12 to the wafer 11 may be obtained by heating. Consequently, the tape member 12 may be strongly bonded to the wafer 11.

Moreover, the heaters 211 are radially arranged from the center to the side of the outside diameter of the storage section 220 in the diameter direction. Therefore, the whole circumference of the tape member 12 may be uniformly heated. Moreover, irregularity in heating on the sides of the inside diameter and the outside diameter of the tape member 12 may be prevented by adopting the above radial arrangement. Moreover, the tape member 12 is indirectly heated through the upper bottom surface 64a. Therefore, in comparison with a case in which the tape member 12 is directly heated by the heaters 211, irregular heating may be more preferably prevented from being caused, and further uniform heating may be realized.

Furthermore, the insulating material 213a is installed on the side of the upper surface of the storage section 220, the insulating material 213b is installed on the side 62a of one end of the damper member 62, and the insulating material 213c is installed on the near side of the tape bonding device 200. Consequently, the handles 65a and 65b which the operator often holds by hand may be prevented from being heated by the heaters 211, and the operator may more easily treat the handles, and the production efficiency may be improved.

Though the first through the third embodiments according to the present invention have been explained above, various kinds of changes and modifications of the present invention may be made. The changes and the modifications will be described hereinafter.

In the above-described embodiments, a work piece such as the wafer 11 and the glass substrate 101 has been mounted on the rubber sheet 25. However, there may be applied another configuration in which for example, a sheet-like resin member is mounted on the upper surface of the above rubber sheet 25, and a work piece is mounted on the upper portion of the above sheet-like member. According to the above configuration, attachment of dust and dirt on a work piece may be prevented, wherein the attachment is caused by rubbing of the rubber sheet 25, and the number of cleaning steps and the like using a post cleaning processing device may be reduced.

Moreover, in the above-described embodiments, there has been adopted a configuration in which a work piece such as the wafer 11 and the glass substrate 101 has been mounted on the rubber sheet 25, and the rubber sheet 25 is expanded upward for contact with the tape member 12. But the relation among positions of the above components in the up-and-down direction may be configured to be inversed. That is, there may be also applied a configuration in which the rubber sheet 25 is arranged in the uppermost portion, the work piece is arranged in the mid-portion, the tape member 12 is arranged in the lowermost portion, and the rubber sheet 25 is expanded downward for contact with the tape member 12. However, in the above case, the relation between the positions of the first and the second vacuum chambers is required to be inversed in the up-and-down direction. Moreover, in order to prevent a work piece from falling by gravitation before bonding, a unit for fixing a work piece on the rubber sheet 25 is required to be provided. Specifically, there may be applied, for example, a method by which an adhesive member or the like is provided on the rubber sheet 25, and a work piece is fixed, using the adhesive member, or a method by which fixing is made by providing an engaging member on a work piece. In the above cases, as it is assumed that the work piece is peeled off from the tape member 12 when expansion of the rubber sheet 25 is released for restoring after the work piece is bonded to the tape member 12, there may be applied a configuration in which the work piece is fixed to the rubber sheet 25, for example, by an electromagnetic unit, and electromagnetic force is released when bonding is completed. According to the above configuration, even when there exists a portion with insufficient bonding between the tape member 12 and the work piece, the above portion may be prevented from being peeled off, because the work piece is pressed against the tape member 12 by the gravitation.

Furthermore, a holding section which protrudes toward the side of the outside diameter for easy takeoff may be provided on the tape frame 28. Thereby, the tape frame 28, and the tape member 12 and the work piece which are installed on the tape frame 28 may be easily taken off to the outside by the operator.

Furthermore, a tongue-like piece of a pivoting method may be installed on the side of the lower surface of the tape frame 28. After completion of bonding, the tongue-like piece of a pivoting method is pivoted, and is applied against the side of the lower surface of the work piece. According to the above configuration, the gravitation of the work piece may be supported by the tongue-like piece. Thereby, even if there is a portion with insufficient bonding between the work piece and the tape member 12, the tape member may be prevented from being peeled off between the work piece and the tape member 12.

Moreover, the seal ring 24 has been installed in the main-body top-surface section 22 in the respective embodiments. However, the seal ring 24 may be installed on the side of the cover body section 60. According to the above configuration, the ring applied section is provided in the main-body top-surface section 22.

In addition, the above-described embodiments have explained that the rubber sheet 25 is used as an elastic sheet member. However, the elastic sheet member is not limited to the rubber sheet 25, and a resin material such as elastomer resin, other than a rubber material, may be applied. Moreover, the above-described embodiments have explained that the pressing ring 26 is used as a holding member. However, the holding member is not limited to the pressing ring 26, and a material with a bonding property, such as a bonding agent which is spread over the inside diameter section 22a, may be used as the holding member. Moreover, the shape of the holding member is not limited to the ring-like shape, and various kinds of shapes such as a ring shape forming a polygon in the outer diameter may be adopted.

Moreover, the above-described embodiments have explained a case in which the tape frame 28 is used as a tape holding unit. However, the tape holding unit is not limited to the tape frame 28, and, for example, a pair of rod-like members may be used as a tape holding unit. In this case, there is obtained a configuration in which the tape member 12 is stretched under a state in which tension is given to between the pair of rod-like members.

Moreover, a controlling unit with a configuration in which control conditions are set beforehand may be applied, or a configuration in which control conditions may be arbitrarily set by the side of the operator may be applied. Furthermore, any configurations, regardless of the shape, in which a space between the main body section 20 and the cover body section 60 is made airtight by blocking may be applied as the sealing member. Moreover, display members such as liquid crystal as a display device, a special glass material, a glass substrate for organic EL, and the like, other than a wafer for manufacturing a semiconductor device, may be adopted as the work piece. As electronic components used for semiconductor devices, display devices, and the like may be manufactured without reducing the yield rate by using the embodiments according to the present invention, costs for manufacturing the above electronic components may be made cheaper. Furthermore, the present invention may be applied even to manufacturing steps for electronic components other than the above-described parts. Moreover, though the atmosphere (air) has been introduced after a vacuum state in the above-described embodiments, there may be applied a configuration in which a state with a higher pressure is made by introducing, for example, argon gas, other than air in comparison with the vacuum state.

Moreover, the above-described second embodiment has explained a case in which the engaging pin 117 is used as a protruding portion. However, the protruding portion is not limited to the engaging pin 117, and any members which may engage the notch section 134 may be applied. Moreover, a relation with regard to projections and depressions between the engaging pin 117 and the notch section 134 may be inversed.

Furthermore, the above-described second embodiment has used the balancer mechanism 110, the supporting stand 120, and the arm 130 as the opening and closing auxiliary unit. However, the opening and closing auxiliary unit is not limited to the above components. An opening and closing auxiliary unit which is provided with a driving unit such as a motor and a hydraulic jack may be adopted without adopting, for example, the opening and closing auxiliary unit by which the cover body section 60 is opened and closed by the configuration in which the operator holds the handles 65a through 65c, and the like by hand. Moreover, an opening and closing auxiliary unit which is provided with an air actuator supplying air by use of the vacuum pump 36 may be adopted. Moreover, when the cover body section 60 is light, and the like, a configuration in which the opening and closing auxiliary unit is eliminated may be adopted.

Moreover, the above-described second embodiment has explained a case in which the locking mechanism 140 is used as an opening-and-closing lock unit. However, the opening-and-closing lock unit is not limited to the locking mechanism 140. There may be applied, for example, a configuration in which an inserting hole is provided on the side of the main body section 20, and, at the same time, a pawl section for pivoting under receiving the energizing force of a spring is provided on the side of the cover body section 60 in such a way that the pawl section engages the inserting hole when the cover body section 60 is closed, and opening of the cover body section 60 is locked by engagement of the pawl section in the inserting hole. Moreover, there may be applied a configuration in which the opening-and-closing lock unit is eliminated.

Furthermore, the above-described embodiments have adopted a configuration in which the short pin 150 as a pin member and the first supporting member, and the long pin 151 as a pin member and the second supporting member are provided on the pressing ring 26. However, other than the configuration in which the short pin 150 and the long pin 151 are provided on the pressing ring 26, a configuration in which the short pin 150 and the long pin 151 are provided on a portion opposing to the pressing ring 26 on the tape frames 28 may be applied. Moreover, a configuration in which convex portions are formed in a portion opposing to the pressing ring 26 on the tape frames 28, portions with a longer protruding length among the above convex portions are assumed to be a first supporting member, and portions with a shorter protruding length among the above convex portions are assumed to be a second supporting member may be applied.

Moreover, the above-described third embodiment has explained a case in which the heaters 211 for heating the tape member 12 are used as a heating means. However, when the thermal resistance of the rubber sheet 25 is excellent, the side of the glass substrate 101 may be heated.

Moreover, when the tape member 12 is a polarizing film in the above-described second embodiment, a peeling mechanism for peeling off the tape member 12 may be provided in the tape bonding device 100. Here, various kinds of configurations such as a configuration in which a suction holding mechanism for sucking and holding the tape member 12 and a configuration in which the end portion of the tape member 12 is picked up and is peeled off may be adopted as a peeling mechanism. According to the above configuration, when the tape member 12 is separated (peeled off) in the tape bonding device 100, using the peeling mechanism, dust may be prevented from adhering to the surface (upper surface portion or four corner portions) of the glass substrate 101. Especially, it has been difficult at the current state to prevent dust from adhering to the surface of the glass substrate 101 even if the tape member 12 is peeled off in a clean room. But, when the tape bonding device 100 according to the present embodiment is used, dust may be more surely prevented from adhering to the glass substrate 101 because the tape member 12 is peeled off in a vacuum.

Moreover, when the tape member 12 is a UV-hardening-type tape film in the above-described second embodiment, a peeling mechanism for peeling off the tape member 12 may be provided in the tape bonding device 100. Here, various kinds of mechanisms such as a suction holding mechanism for peeling off the tape member 12 and a mechanism in which the end portion of the tape member 12 is picked up and is peeled off may be provided as a peeling mechanism in the tape bonding device 100. Moreover, when a suction holding mechanism is provided, a configuration in which suction of the above-described vacuum pump 36 is used may be adopted. By providing the above-described peeling mechanisms, the tape member 12 may be peeled off in the inside of the tape bonding device 100 for vacuum suction. Therefore, dust may be prevented from adhering to the surface of the glass substrate 101 when the tape is peeled off.

Moreover, when the tape member 12 uses a UV-hardening-type tape in the tape bonding devices 10, 100, and 200 according to the above-described embodiments, there may be applied a configuration in which an ultraviolet irradiation device for irradiation of ultraviolet light is provided, for example, in the inside of the cover body section 60 or the main body section 20, and the glass substrate 101 is irradiated by the ultraviolet light. In the above case, processing till a step at which the tape member 12 is cured by irradiating ultraviolet light is performed in the tape bonding devices 10, 100, and 200.

Moreover, the tape member 12 is not limited to a tape for protection, a UV-hardening-type tape, and a polarizing film, and various kinds of members bonded to a work piece such as a transparent electrode may be used as the tape member 12.

Moreover, after separately bonding the tape member 12 to the wafer 11 and the glass substrate 101, a mechanism for cutting the tape member 12 may be provided in the tape bonding devices 10, 100, and 200.

Moreover, though a work piece has been bonded to the tape member 12 in a vacuum according to the above-described embodiments, bonding may be performed, for example, under normal pressures. That is, the reason is that, if there is caused a difference in atmospheric pressure in such a way that the work piece is moved to the side of the tape member 12 when the rubber sheet 25 on which a work piece is mounted is moved up and down, the rubber sheet 25 and the tape member 12 may be bonded to each other. Specifically, even by a configuration in which the first vacuum chamber 50 located on the side of the upper surface of the rubber sheet 25 is made into a state opened to the air, and the second vacuum chamber 51 located on the side of the lower surface of the rubber sheet 25 is made into a pressurized state, the rubber sheet 25 and the tape member 12 may be bonded to each other after moving the rubber sheet 25 to the side of the tape member 12. Or, even by a configuration in which the second vacuum chamber 51 located on the side of the lower surface of the rubber sheet 25 is made into a state opened to the air, and the first vacuum chamber 50 located on the side of the upper surface of the rubber sheet 25 is made into a decompressed state, the rubber sheet 25 and the tape member 12 may be bonded to each other after moving the rubber sheet 25 to the side of the tape member 12. Furthermore, the original object may be achieved even without obtaining a state opened to the air in the above case, if there is formed the fully enough capacity of the vacuum chamber which is made into a state opened to the air. As described above, the rubber sheet 25 may be expanded upward by a configuration in which the pressure of the inside of the first vacuum chamber 50 as a first chamber is lower than that of the second vacuum chamber 51 as a second chamber. Furthermore, the rubber sheet 25 may be expanded downward by a configuration in which the pressure of the first chamber is increased to a pressure higher than that of the second chamber. Here, an adjusting unit is configured to include the air duct 33, the tube member 35, the protruded tube section 35a, the vacuum pump 36, the first valve member 37, the air duct 38, the tube member 40, the protruded tube section 40a, the second valve member 41, and the like. Moreover, for example, a booster pump, other than the vacuum pump may be used as the adjusting unit. That is, as only a difference in internal pressure between the first chamber and the second chamber is required to be generated, not only the vacuum pump, but also the booster pump may be used.

INDUSTRIAL APPLICABILITY

The tape bonding device, the method for bonding a tape, and the method for manufacturing electronic components according to the present invention may be used for processing by which a semiconductor integrated circuit using a wafer is manufactured, and for processing by which a liquid crystal display device using liquid crystal is manufactured. That is, the present invention may be used for a semiconductor manufacturing industry, and the like. Moreover, the present invention may be also used for an industry for manufacturing a display using a glass substrate, and the like.

Figure 6:
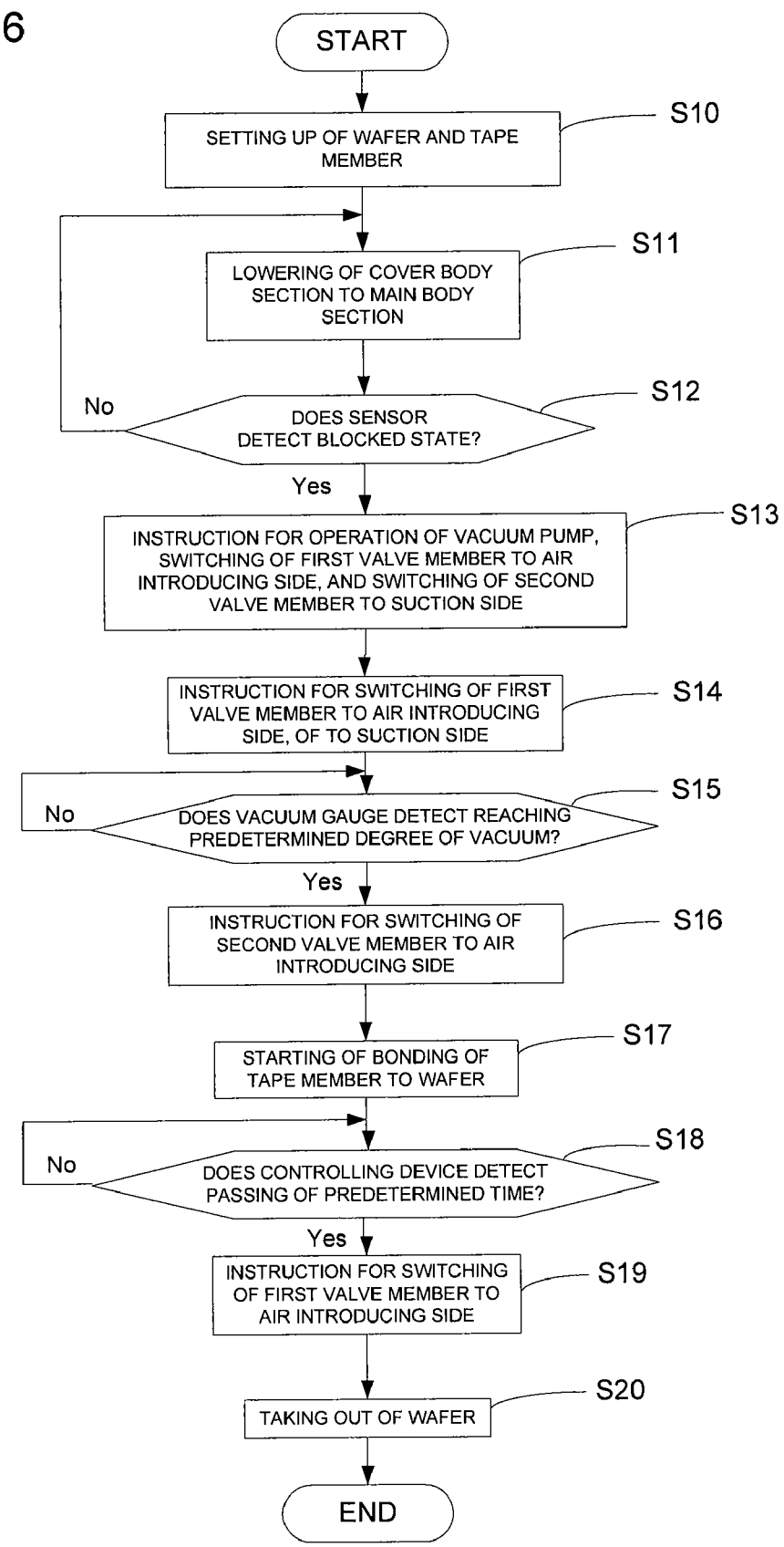
FIG. 6 is a view showing an operation flow for a case in which a tape member is bonded to a wafer, using the tape bonding device shown in FIG. 1.

FIG. 6
START
S10 SETTING UP OF WAFER AND TAPE MEMBER
S11 LOWERING OF COVER BODY SECTION TO MAIN BODY SECTION
S12 DOES SENSOR DETECT BLOCKED STATE?
S130 INSTRUCTION FOR OPERATION OF VACUUM PUMP, SWITCHING OF FIRST VALVE MEMBER TO AIR INTRODUCING SIDE, AND SWITCHING OF SECOND VALVE MEMBER TO SUCTION SIDE
S14 INSTRUCTION FOR SWITCHING OF FIRST VALVE MEMBER TO AIR INTRODUCING SIDE, OF TO SUCTION SIDE
S15 DOES VACUUM GAGE DETECT REACHING PREDETERMINED DEGREE OF VACUUM?
S16 INSTRUCTION FOR SWITCHING OF SECOND VALVE MEMBER TO AIR INTRODUCING SIDE
S17 STARTING OF BONDING OF TAPE MEMBER TO WAFER
S18 DOES CONTROLLING DEVICE DETECT PASSING OF PREDETERMINED TIME?
S19 INSTRUCTION FOR SWITCHING OF FIRST VALVE MEMBER TO AIR INTRODUCING SIDE
S20 TAKING OUT OF WAFER

The invention claimed is:

1. A method for bonding a tape by which a tape member is bonded to a work piece, comprising:
a sucking step at which, in a state in which said work piece is mounted on the upper surface of an elastic sheet member, and said tape member is located in a stretched state in the upper portion of said work piece by a tape holding unit, vacuum suction of a first vacuum chamber located on the side of the upper surface of said elastic sheet member is performed by a first sucking unit, and, at the same time, vacuum suction of a second vacuum chamber located on the side of the lower surface of said elastic sheet member is performed by a second sucking unit;
a vacuum achievement detecting step at which it is detected that said first vacuum chamber and said second vacuum chamber have reached a predetermined degree of vacuum by said sucking step;
a first air introducing step at which, after reaching the degree of vacuum predetermined by said vacuum achievement detecting step is detected, vacuum suction of said second vacuum chamber is stopped by stopping operation of said second sucking unit, and, at the same time, the air is introduced into said second vacuum chamber by operating a second air introducing unit;
a bonding step at which, after said first air introducing step, said elastic sheet member is expanded toward the inside of said first vacuum chamber, said work piece is raised toward said tape member by expanding said elastic sheet member, and said work piece is bonded to said tape member; and
a second air introducing step at which, after executing said bonding step for a predetermined time, the air is introduced into said first vacuum chamber by operating a first air introducing unit; and
at said sucking step, when said first and said second sucking units are operated, said second sucking unit is initially operated, and then said first sucking unit is operated.

2. The method for bonding a tape according to claim 1, comprising a heating step at which a heat-hardening-type bonding agent is spread over said tape member, and, at the same time, said tape member is heated before said tape member is bonded to said work piece at said bonding step.

3. A method for manufacturing electronic components by which a tape member is bonded to a work piece to manufacture said electronic components, comprising:
a sucking step at which, in a state in which said work piece is mounted on the upper surface of an elastic sheet member, and said tape member is located in a stretched state in the upper portion of said work piece by a tape holding unit, vacuum suction of a first vacuum chamber located on the side of the upper surface of said elastic sheet member is performed by a first sucking unit, and, at the same time, vacuum suction of a second vacuum chamber located on the side of the lower surface of said elastic sheet member is performed by a second sucking unit;

a vacuum achievement detecting step at which it is detected that said first vacuum chamber and said second vacuum chamber have reached a predetermined degree of vacuum by said sucking step;

a first air introducing step at which, after reaching the degree of vacuum predetermined by said vacuum achievement detecting step is detected, vacuum suction of said second vacuum chamber is stopped by stopping operation of said second sucking unit, and, at the same time, the air is introduced into said second vacuum chamber by operating a second air introducing unit;

a bonding step at which, after said first air introducing step, said elastic sheet member is expanded toward the inside of said first vacuum chamber, said work piece is raised toward said tape member by expanding said elastic sheet member, and said work piece is bonded to said tape member; and a second air introducing step at which, after executing said bonding step for a predetermined time, the air is introduced into said first vacuum chamber by operating a first air introducing unit; and at said sucking step, when said first and said second sucking units are operated, said second sucking unit is initially operated, and then said first sucking unit is operated.

4. The method for manufacturing electronic components according to claim 3, comprising a heating step at which a heat-hardening-type bonding agent is spread over said tape member, and, at the same time, said tape member is heated before said tape member is bonded to said work piece at said bonding step.

5. A tape bonding device for bonding a tape member to a work piece, comprising:

an elastic sheet member on the upper surface of which the work piece is mounted;

a sealable first vacuum chamber which is located on the side of the upper surface of said elastic sheet member, and, at the same time, is divided by said elastic sheet member;

a sealable second vacuum chamber which is located on the side of the lower surface of said elastic sheet member, and, at the same time, is divided by said elastic sheet member;

a holding member which holds said elastic sheet member in a state in which the air is prevented from coming and going between said first vacuum chamber and said second vacuum chamber;

a tape holding unit which holds said tape member in a stretching state, and, at the same time, locates said tape member in the upper portion of said work piece mounted on said elastic sheet member;

a first sucking unit for vacuum suction of the inside of said first vacuum chamber;

a first air introducing unit which introduces the air into the inside of said first vacuum chamber;

a second sucking unit for vacuum suction of the inside of said second vacuum chamber;

a second air introducing unit which introduces the air into the inside of said second vacuum chamber; and a controlling unit which controls the operations of said first sucking unit, said second sucking unit, said first air introducing unit, and said second air introducing unit, wherein said controlling unit performs vacuum suction of said first and said second vacuum chambers by operating said first and second sucking units, introduces the air into said second vacuum chamber by operating said second air introducing unit after said vacuum suction, expands said elastic sheet member toward the inside of said first vacuum chamber by introducing said air, and raises said work piece toward said tape member for bonding said work piece to said tape member by expanding said elastic sheet member; and said controlling unit initially operates said second sucking unit, and then operates said first sucking unit at operation of said first and said second sucking units.

6. The tape bonding device according to claim 5, wherein said tape bonding device has a main body section, and a cover body section provided reopenable to said main body section, a sealing member, by which a space between said cover body section and said main body section is blocked airtight when said cover body section is closed to said main body section, is provided in a boundary portion between said cover body section and said main body section, said first vacuum chamber is formed between said cover body section and said elastic sheet member in the blocked state of said cover body section, and, at the same time, said second vacuum chamber is formed between a space section existing in said main body section and said elastic sheet member.

7. The tape bonding device according to claim 6, wherein said cover body section has a concave section which is depressed upward in the blocked state of said cover body section, and, at the same time, the upper bottom surface of said concave section presses downward said work piece and said tape member, which move upward, based on expansion of said elastic sheet member.

8. The tape bonding device according to claim 6, wherein a sensor is provided in a boundary portion between said cover body section and said main body section in order to detect a state in which said cover body section is closed to said main body section, and may transmit a detection signal to said controlling unit, and said controlling unit operates said first sucking unit or said second sucking unit only when said detection signal corresponding to the state in which said cover body section is closed is received from said sensor.

9. The tape bonding device according to claim 5, wherein said tape holding unit is installed to said holding member through a pin member.

10. A tape bonding device for bonding a tape member to a work piece, comprising:

an elastic sheet member on the upper surface of which the work piece is mounted;

a sealable first vacuum chamber which is located on the side of the upper surface of said elastic sheet member, and, at the same time, is divided by said elastic sheet member;

a sealable second vacuum chamber which is located on the side of the lower surface of said elastic sheet member, and, at the same time, is divided by said elastic sheet member;

a holding member which holds said elastic sheet member in a state in which the air is prevented from coming and going between said first vacuum chamber and said second vacuum chamber;

a tape holding unit which holds said tape member in a stretching state, and, at the same time, locates said tape member in the upper portion of said work piece mounted on said elastic sheet member;

a first sucking unit for vacuum suction of the inside of said first vacuum chamber;

a first air introducing unit which introduces the air into the inside of said first vacuum chamber;

a second sucking unit for vacuum suction of the inside of said second vacuum Chamber; and a second air introducing unit which introduces the air into the inside of said second vacuum chamber; and said tape holding unit is installed to said holding member through a pin member, said work piece is a glass substrate, and said pin member is provided with:

a first supporting member which is provided in said holding member, and, at the same time, protrudes from said holding member towards said tape holding unit; and a plurality of second supporting members which are provided in said holding member, and protrude from said holding member towards said tape holding unit, and the protruding length of the second supporting members is longer than that of said first supporting member.

11. The tape bonding device according to claim 6, wherein said cover body section is provided with an opening and closing auxiliary unit which assists opening and closing of said cover body section to said main body section.

12. A tape bonding device for bonding a tape member to a work piece, comprising:

an elastic sheet member on the upper surface of which the work piece is mounted;

a sealable first vacuum chamber which is located on the side of the upper surface of said elastic sheet member, and, at the same time, is divided by said elastic sheet member;

a sealable second vacuum chamber which is located on the side of the lower surface of said elastic sheet member, and, at the same time, is divided by said elastic sheet member;

a holding member which holds said elastic sheet member in a state in which the air is prevented from coming and going between said first vacuum chamber and said second vacuum chamber;

a tape holding unit which holds said tape member in a stretching state, and, at the same time, locates said tape member in the upper portion of said work piece mounted on said elastic sheet member;

a first sucking unit for vacuum suction of the inside of said first vacuum chamber;

a first air introducing unit which introduces the air into the inside of said first vacuum chamber;

a second sucking unit for vacuum suction of the inside of said second vacuum chamber; and a second air introducing unit which introduces the air into the inside of said second vacuum chamber;

wherein said tape bonding device has a main body section, and a cover body section provided reopenable to said main body section, a sealing member, by which a space between said cover body section and said main body section is blocked airtight when said cover body section is closed to said main body section, is provided in a boundary portion between said cover body section and said main body section, said first vacuum chamber is formed between said cover body section and said elastic sheet member in the blocked state of said cover body section, and, at the same time, said second vacuum chamber is formed between a space section existing in said main body section and said elastic sheet member, said cover body section is provided with an opening and closing auxiliary unit which assists opening and closing of said cover body section to said main body section, said opening and closing auxiliary unit includes:

an installing shaft which extends from a supporting point around which said cover body section is pivoted, the installing shaft extending in a direction opposite to which said cover body section extends from said supporting point;

weights installed on said installing shaft;

a protruding portion provided in said installing shaft;

an arm which is pivotably provided to said main body section, is provided on the side of said main body section on which said installing shaft is provided, and, at the same time, extends toward said installing shaft; and a notch section which is provided on said arm at a location into which said protruding portion runs, engages said protruding portion, restricts pivoting of said arm when said protruding portion engages said notch section, and keeps maintaining the opened state of said cover body section by maintaining the engaged state of said protruding portion.

13. The tape bonding device according to claim 6, wherein an opening-and-closing lock unit which prevents said cover body section from opening in the closed state of said cover body section is provided between said cover body section and said main body section.

14. The tape bonding device according to claim 7, wherein a heat-hardening-type bonding agent is spread over said tape member, said cover body section is provided with a heating means, and said tape member is heated by said heating means when said tape member is bonded to said work piece.

15. The tape bonding device according to claim 14, wherein a plurality of said heating means are provided in a storage section adjacent to said concave portion on said cover body section, and, at the same time, the plurality of said heating means are radially arranged in said storage section.

* * * * *